United States Patent
Sakhare et al.

(10) Patent No.: US 8,224,607 B2
(45) Date of Patent: Jul. 17, 2012

(54) METHOD AND APPARATUS FOR ROBOT CALIBRATIONS WITH A CALIBRATING DEVICE

(75) Inventors: Vijay Sakhare, Bangalore (IN); Sekar Krishnasamy, Karnataka (IN); Mordechai Leska, Rishon Le-Zion (IL); Donald Foldenauer, San Jose, CA (US); Rinat Shimshi, San Jose, CA (US); Marvin L. Freeman, Round Rock, TX (US); Jeffery Hudgens, San Francisco, CA (US); Satish Sundar, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 806 days.

(21) Appl. No.: 12/198,076

(22) Filed: Aug. 25, 2008

(65) Prior Publication Data

US 2009/0062959 A1    Mar. 5, 2009

Related U.S. Application Data

(60) Provisional application No. 60/969,123, filed on Aug. 30, 2007.

(51) Int. Cl.
  *G01C 17/38* (2006.01)
(52) U.S. Cl. ........................................................ 702/95
(58) Field of Classification Search ...................... 702/95
  See application file for complete search history.

(56) References Cited

U.S. PATENT DOCUMENTS

| | | | |
|---|---|---|---|
| 5,740,062 A | 4/1998 | Berken et al. | |
| 5,915,915 A | 6/1999 | Allen et al. | |
| 5,917,601 A | 6/1999 | Shimazaki et al. | |
| 6,198,976 B1 | 3/2001 | Sundar et al. | |
| 6,392,810 B1 | 5/2002 | Tanaka | |
| 6,493,652 B1 * | 12/2002 | Ohlenbusch et al. | 702/160 |
| 6,556,887 B2 | 4/2003 | Freeman et al. | |
| 6,591,160 B2 | 7/2003 | Hine et al. | |
| 6,591,161 B2 | 7/2003 | Yoo et al. | |
| 6,629,053 B1 * | 9/2003 | Mooring | 702/94 |
| 6,697,517 B1 | 2/2004 | Hunter | |
| 6,819,938 B2 * | 11/2004 | Sahota | 455/522 |
| 7,085,622 B2 | 8/2006 | Sadighi et al. | |
| 7,151,609 B2 * | 12/2006 | Chalmers et al. | 356/630 |
| 7,205,742 B2 | 4/2007 | Adachi et al. | |

(Continued)

OTHER PUBLICATIONS

Biala, Nazario , "An Introduction to Fiber-Optic Sensors", http://www.sensorsmag.com/articles/1201/40/main.shtml,, (Dec. 1, 2001), 1-8.

(Continued)

*Primary Examiner* — Aditya Bhat
(74) *Attorney, Agent, or Firm* — Blakely, Sokoloff, Taylor & Zafman LLP

(57) ABSTRACT

Described herein is a method and apparatus for performing calibrations on robotic components. In one embodiment, a method for performing robotic calibrations includes moving the calibrating device across a target (e.g., a wafer chuck). Next, the method includes measuring distances between light spots from the sensors and a perimeter of the target using the sensors located on the calibrating device. Next, the method includes determining a displacement of the calibrating device relative to a center of the target. Then, the method includes determining a rotation angle of the calibrating device relative to a system of coordinates of the target. Next, the method includes calibrating a robot position of the robot based on the displacement and rotation angle of the calibrating device with respect to the target.

13 Claims, 18 Drawing Sheets

U.S. PATENT DOCUMENTS

| | | |
|---|---|---|
| 7,233,841 B2 | 6/2007 | Sadighi et al. |
| 2002/0100053 A1 | 7/2002 | Nguyen et al. |
| 2003/0002452 A1 | 1/2003 | Sahota |
| 2003/0014157 A1 | 1/2003 | Freeman et al. |
| 2003/0198376 A1 | 10/2003 | Sadighi et al. |
| 2004/0199291 A1 | 10/2004 | Freeman et al. |
| 2005/0096794 A1 | 5/2005 | Yim et al. |
| 2005/0102064 A1 | 5/2005 | Donoso et al. |
| 2006/0164657 A1 | 7/2006 | Chalmers et al. |
| 2007/0106306 A1 | 5/2007 | Bodduluri et al. |
| 2010/0024186 A1 | 2/2010 | Bailey, III |

OTHER PUBLICATIONS

Cyperoptics, "WaferSense Auto Teaching System Theory of Operation", www.cyberopticssemi.com, (2006), 2 pages.

PCT, International Search Report and Written Opinion for PCT International Appln. No. PCT/US2008/10262, mailed Nov. 13, 2008 (8 pages).

PCT, International Preliminary Report on Patentability for PCT International Appln. No. PCT/US2008/10262, mailed Mar. 2, 2010 (5 pages).

PCT, International Search Report and Written Opinion for PCT International Appln. No. PCT/US2008/10240, mailed Nov. 21, 2008 (8 pages).

PCT, International Preliminary Report on Patentability for PCT International Appln. No. PCT/US2008/10240, mailed Mar. 2, 2010 (5 pages).

Victrex, "Material Properties Guide", 23 pages.

* cited by examiner

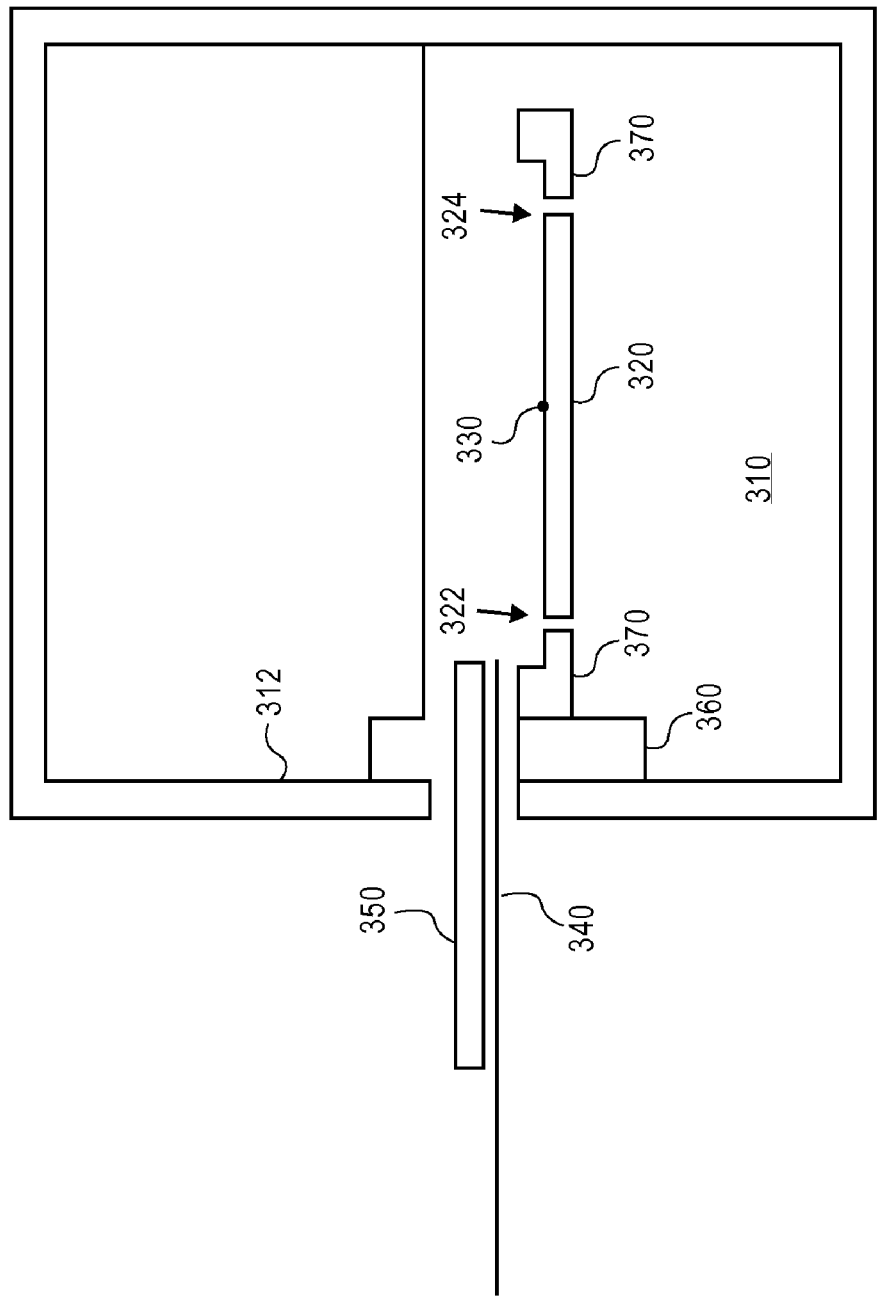

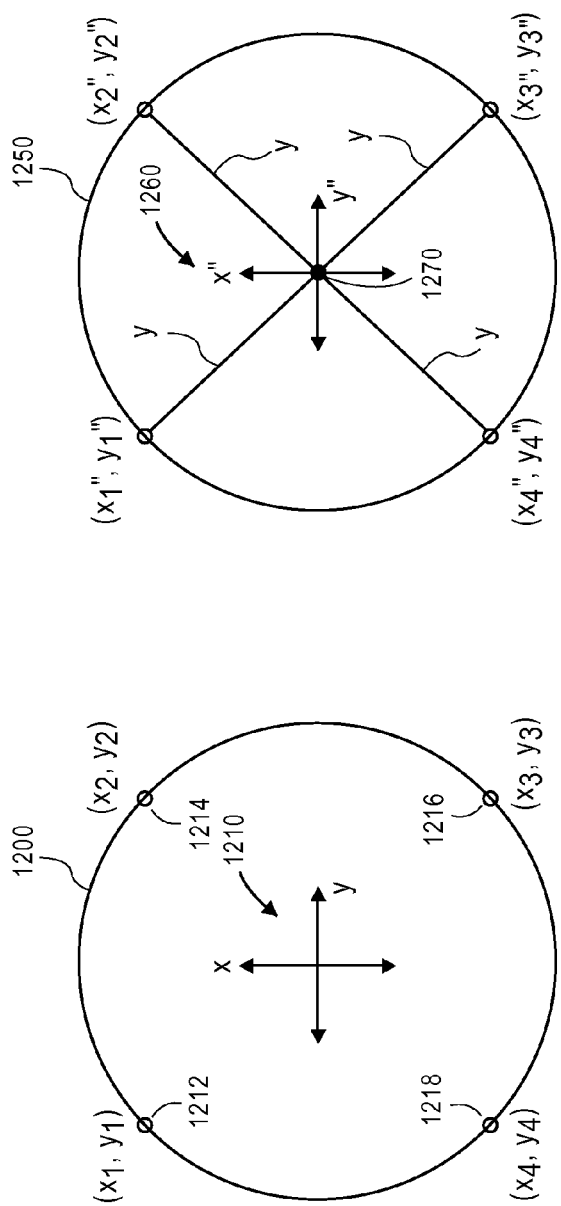
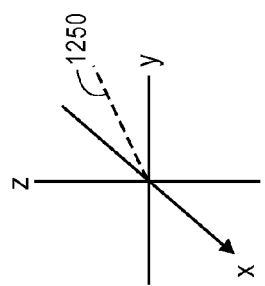
FIG. 12B
FIG. 12C
FIG. 12A

METHOD AND APPARATUS FOR ROBOT CALIBRATIONS WITH A CALIBRATING DEVICE

RELATED APPLICATIONS

This application claims the priority benefit of U.S. Provisional Patent Application No. 60/969,123, filed on Aug. 30, 2007 and entitled, "METHOD AND APPARATUS FOR ROBOT CALIBRATIONS WITH A CALIBRATING DEVICE," which is incorporated herein by reference.

TECHNICAL FIELD

Embodiments of the present invention relate to robot calibration, and more specifically to using a sensory calibrating device for robot calibrations.

BACKGROUND

Many industries employ sophisticated manufacturing equipment that includes multiple sensors, controls, and robotic components, each of which may be carefully monitored during processing to ensure product quality. The robotic components require calibrations to accurately define preset positions of the robot system's mechanisms to ensure that the system functions properly. By calibrating the mechanical mechanisms of the robot, proper handoff of objects can be established between the robot and manufacturing equipment components (e.g., loading station, auxiliary chambers, process chambers). Robot calibrations are required for various reasons including after initial installation, after servicing a component, preventive maintenance, restarting or recalibrating the manufacturing equipment, and any other time that the robot's absolute positioning may have changed.

For some manufacturing equipment (e.g., semiconductor fabrication equipment, automotive manufacturing equipment) it is expensive and time consuming to completely shut down the equipment for the time necessary to perform the calibrations. Conventional methods of performing calibrations generally require completely or partially shutting down the equipment. For example, calibrations for robotic components of semiconductor processing equipment is generally performed by taking the equipment off-line from normal manufacturing operations. A robot that needs to be calibrating for transferring wafers to and from a processing chamber requires taking the processing chamber off-line (e.g., removing process gases, altering pressure, voltages, magnetic field, etc), opening the processing chamber and manually performing calibrations. Typically, maintenance personally align a pin or jig into a component of the processing chamber and then manually perform calibrations between the robot handling system and the processing chamber. After calibrations have been completed, the pin or jig is physically removed, and then the lid of the processing chamber is closed. Manufacturing personnel will then perform qualifications on the processing chamber prior to returning the chamber on-line.

Other prior approaches have attempted to minimize the time and expense of taking manufacturing equipment off-line by using a disc shaped similar to a wafer such that the robot can load and unload the disc into various types of manufacturing equipment. However, this disc requires camera technology for performing the calibrations between the robot and various types of manufacturing equipment. The camera technology must be taught to align to various types of targets found in the manufacturing equipment creating additional complexity and expensive in terms of time, cost, engineering and/or maintenance resources for performing the robot calibrations.

SUMMARY

Described herein is a method and apparatus for performing calibrations on robotic components. In one embodiment, a method for performing robotic calibrations includes sensing start points and end points of a target using sensors located on a calibrating device. The method further includes calculating a center of the target based on the start points and the end points of the target. The method further includes determining an offset between the center of the target and a robot blade positioned in a reference position. The method further includes calibrating a robot position based on the offset.

In another embodiment, a method for performing robotic calibrations includes moving the calibrating device across a target (e.g., a wafer chuck). Next, the method includes measuring distances between light spots from the sensors and a perimeter of the target using the sensors located on the calibrating device. Next, the method includes determining a displacement of the calibrating device relative to a center of the target. Then, the method includes determining a rotation angle of the calibrating device relative to a system of coordinates of the target. Next, the method includes calibrating a robot position of the robot based on the displacement and rotation angle of the calibrating device with respect to the target.

BRIEF DESCRIPTION OF THE DRAWINGS

The present invention is illustrated by way of example, and not by way of limitation, in the figures of the accompanying drawings and in which:

FIGS. 3A-3C illustrate one embodiment of a calibrating device being transferring into a process chamber;

FIG. 12A illustrates a top view of a calibrating device in a first coordinate system in accordance with one embodiment;

FIG. 12B illustrates a top view of a calibrating device in a second coordinate system in accordance with one embodiment;

FIG. 12C illustrates a rotation angle theta θ of a first coordinate system relative to a second coordinate system in accordance with one embodiment.

DETAILED DESCRIPTION

Described herein is a method and apparatus for performing calibrations on robotic components. In one embodiment, a method for performing robotic calibrations includes sensing start points and end points of a target using sensors located on a calibrating device. The method further includes calculating a center of the target based on the start points and the end points of the target. The method further includes determining an offset between the center of the target and a robot blade positioned in a reference position. The method further includes calibrating a robot position based on the offset.

In another embodiment, a method for performing robotic calibrations includes moving the calibrating device across a target (e.g., a wafer chuck). Next, the method includes measuring distances between light spots from the sensors and a perimeter of the target using the sensors located on the calibrating device. Next, the method includes determining a displacement of the calibrating device relative to a center of the target. Then, the method includes determining a rotation angle of the calibrating device relative to a system of coordinates of the target. Next, the method includes calibrating a robot position of the robot based on the displacement and rotation angle of the calibrating device with respect to the target.

In an embodiment, the target is a substrate chuck located in a process chamber. A lid of the process chamber remains closed during calibration of the robot. In another embodiment, following the calibration, the process chamber can quickly return to manufacturing processes because the processing conditions are not altered during the calibration because the calibrating device is a low-particle composite material capable of operating at high temperatures under vacuum with exposure to processing gases. The calibration process with the lid to the process chamber remaining closed results in reduced maintenance time and reduced manufacturing machine down time.

The following description provides details of a manufacturing machine that monitors processes run on manufacturing devices. In one embodiment, the manufacturing machine is for use in the manufacturing of devices (e.g., semiconductor wafers, substrates, liquid crystal displays, reticles). Manufacturing such devices generally requires dozens of manufacturing steps involving different types of manufacturing processes. For example, etching, sputtering, and chemical vapor deposition are three different types of processes, each of which is performed on different chambers of a single machine or on different machines.

Figure 1:
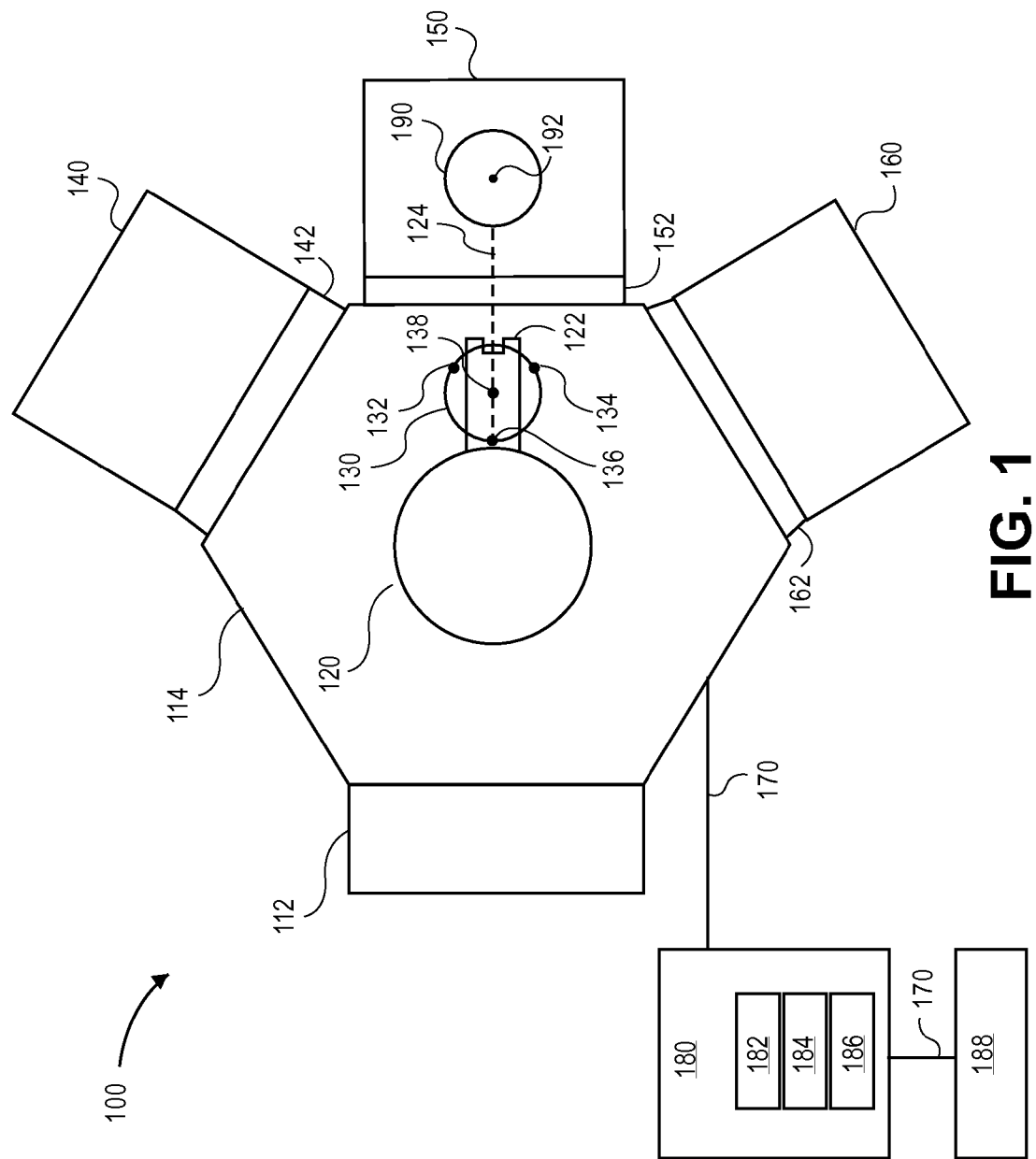
FIG. 1 illustrates one embodiment of a manufacturing machine.

FIG. 1 illustrates one embodiment of a manufacturing machine. The manufacturing machine 100 (e.g., process cluster tool) includes a computing device 180 that includes a processing unit 182, software 184, and memory 186. In one embodiment, the manufacturing machine 100 includes a loading station 112, a robot controller 188, a transfer chamber 114, and chamber ports 142, 152, and 162 associated with processing chambers 140, 150, and 160. The number of processing chamber(s) associated with the transfer chamber can vary. The transfer chamber 114 includes a robot 120, a robot blade 122, and a calibrating device 130 for robot calibrations. The transfer chamber 114 is typically held under pressure. A robot controller 188 controls operations of the robot 120 and may be located in the computing device 180, a separate component, or integrated with the robot 120. Data communication links 170 may include conventional communication links, and may be wired or wireless. Data may be transmitted between the transfer chamber 114, process chambers 140, 150, and 160, calibrating device 130, robot controller 188, and computing device 180 in a raw or processed format.

The robot 120 transfers devices (e.g., semiconductor wafers, substrates, liquid crystal displays, reticles) between the load station 112 and the processing chambers. The robot 120 may need calibrating for a variety of reasons including preventive maintenance, restarting or recalibrating the manufacturing equipment 100, and replacing various components of the manufacturing equipment 100.

In one embodiment, the robot 120 transfers the calibrating device 130 having a plurality of sensors 132, 134, and 136 to at least one processing chamber with a lid of the processing chamber closed. The calibrating device 130 may include a notch in order to properly align the device 130 to an alignment point 138 of the robot blade 122. The alignment point 138 may be a hole, notch, or indent and may be centered in a pocket or depression of the robot blade 122. The plurality of sensors 132, 134, and 136 on the calibrating device 130 sense start points and end points of a target 190 (e.g., wafer or substrate chuck) located in the process chamber when the calibrating device 130 moves linearly across the target 190. The robot blade 122 and the calibrating device 130 enter the process chamber 150 through a slit valve (not shown) with a lid to the chamber remaining closed. The processing chamber may contain processing gases, temperatures, magnetic fields, and pressures at a similar level compared to actual on-line processing conditions.

In one embodiment, the calibrating device 130 records the start and end point raw data measurements that are then sent via a wireless or wired link to the robot controller 188 or the computing device 180. The robot controller 188 may determine the coordinates of the start and end points of the target 190 and the center 192 of the target with respect to a reference position (e.g., zero position) of the robot blade 122. Alternatively, the computing device 180 determines coordinates of the start and end points of the target 190 with respect to the reference position of the robot blade 122. The computing device 180 calculates the center 192 of the target based on the start and end points of the target 190 sensed by the calibrating device 130. The computing device 180 determines an offset between the center 192 of the target 190 and the alignment point 138 or a center line 124 of the robot blade 122 in a reference position. The computing device 180 calibrates the robot 120 based on the offset.

In another embodiment, the robot controller 188 includes a processing unit that performs a portion or all of the previously discussed measurements and calculations necessary for calibrating the robot 120. For example, the robot controller 188 may determine the center 192 of the target 190 based on the start points and the end points.

Figure 2A:
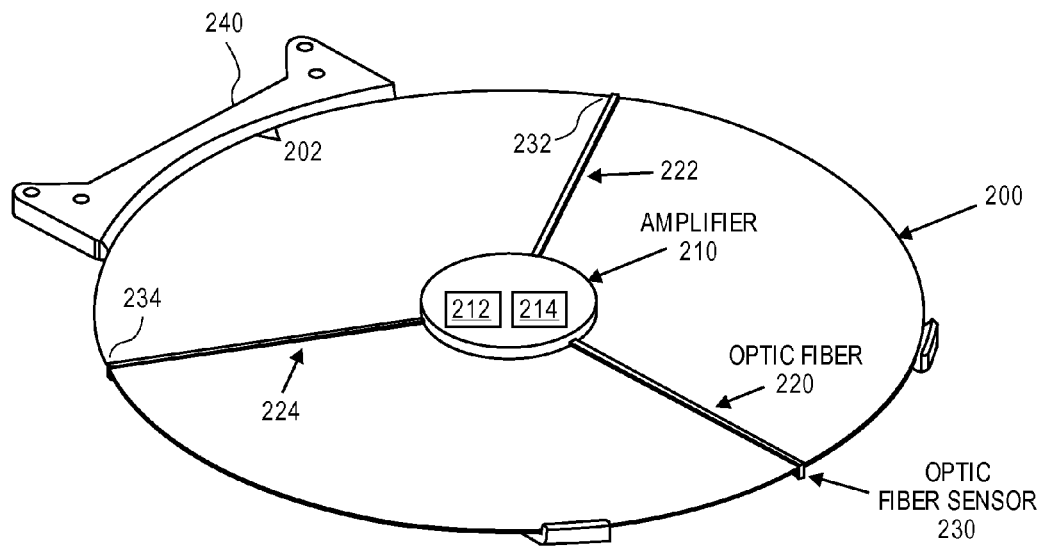
FIG. 2A illustrates a top view of a calibrating device in accordance with one embodiment.

FIG. 2A illustrates a top view of a calibrating device in accordance with one embodiment. The calibrating device 200 is being handled by a robot blade 240. The calibrating device 200 may be aligned to the robot blade 240 with a notch 202 or using other alignment means. The calibrating device 200 is shaped like a device (e.g., wafer, substrate, liquid crystal display) normally being processed by a manufacturing machine. The calibrating device 200 may be circular, square, rectangular or some other shape. The calibrating device 200 may weigh in the range of 100 grams to 350 grams. In one embodiment, the calibrating device has a thickness less than 0.25 inches in order to be transferred into manufacturing machines in a closed position. The calibrating device 200 includes an amplifier 210, optic fiber 220, 222, 224, and optic fiber sensors 230, 232, and 234. The amplifier 210 may contain a power source 212 and a wireless module 214 or have a separately located power source and/or wireless module. The wireless module 214 transmits and/or receives data between the calibrating device 200 and a robot controller or computing device.

In one embodiment, the optic fibers 220, 222, and 224 reflect light inside of the optic fibers. The sensors emit, receive, and convert the light energy into an electrical signal which can be transmitted to a processing unit such as the computing device 180 or robot controller 188 in FIG. 1. The sensors may be configured for various modes of sensing including diffuse reflective, through-beam, and retroreflective.

Figure 2B:
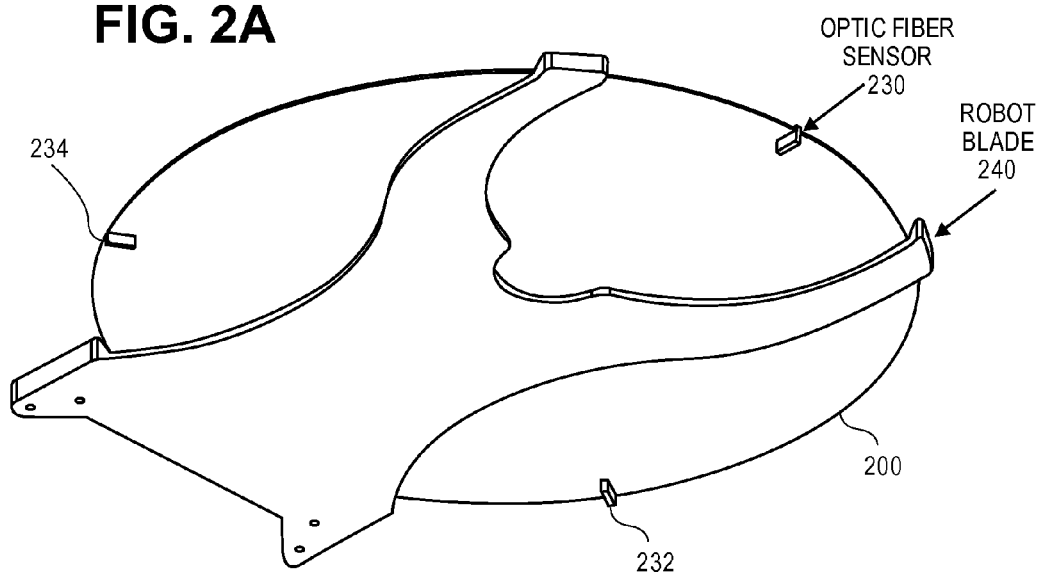
FIG. 2B illustrates a bottom view of a calibrating device in accordance with one embodiment.

FIG. 2B illustrates a bottom view of a calibrating device in accordance with one embodiment. The sensors 230, 232, and 234 and robot blade 240 can be viewed from the bottom of the calibrating device 200. In another embodiment, the three sensors 230, 232, and 234 are located in different positions on the calibrating device 200. In other embodiments, two, three, four, or more sensors are located in different positions on the calibrating device 200. Various components illustrated in FIGS. 2A and 2B may be located on different sides of the calibrating device 200 or be located within the calibrating device 200.

Figure 3A:
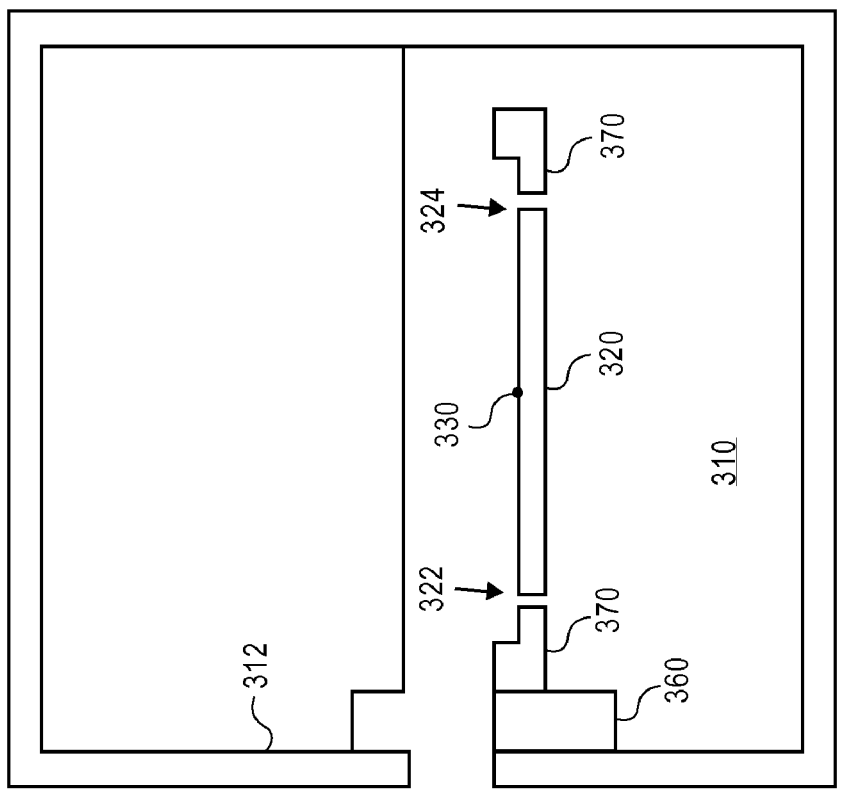
Figure 3A:
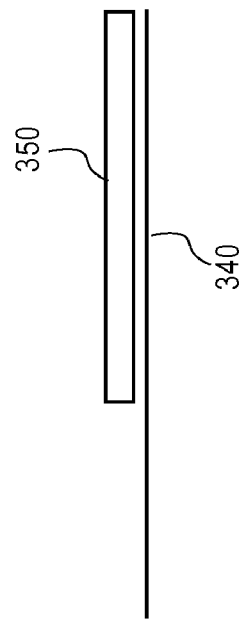
Figure 3C:
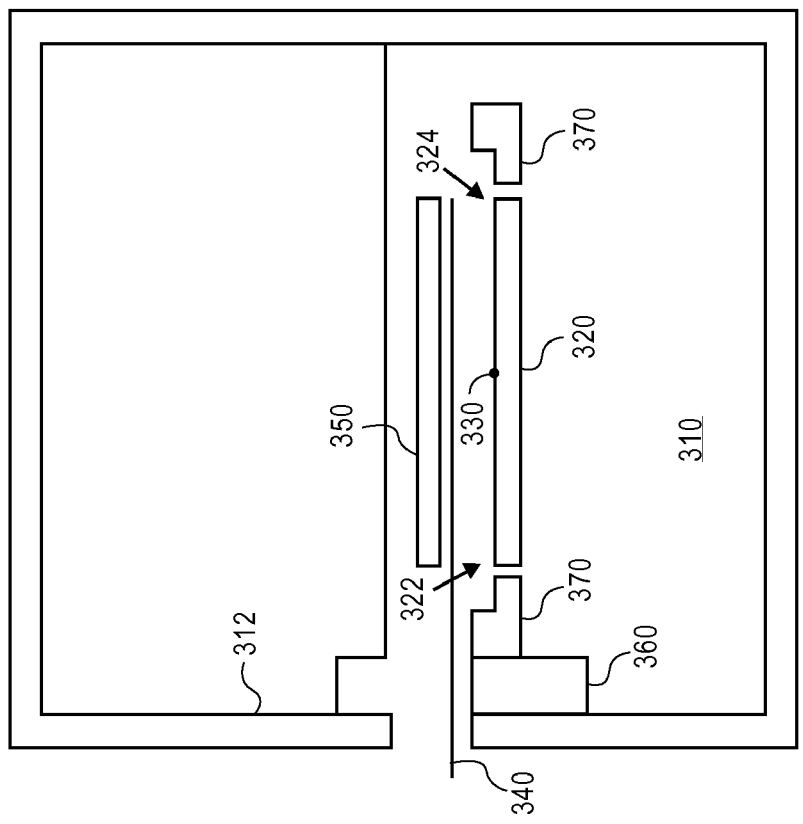

FIGS. 3A-3C illustrate one embodiment of a calibrating device being transferring into a process chamber. A robot blade 340 supports the calibrating device 350 that has been aligned to the robot blade 340. The robot blade 340 transfers the calibrating device 350 through an opening in the chamber 310 with a slit valve 360 of the process chamber 310 being in an open position. The slit valve 360 can be controlled to move into a closed position and seal the chamber 310 which has a lid 312 in a closed position. The processing chamber 310 may contain processing gases, temperatures, magnetic fields, and pressures at a similar level compared to actual on-line processing conditions with the lid 312 in the closed position. The calibrating device 350 passes across an electrostatic chuck 320 and sensors located on the calibrating device 350 sense start 322 and end points 324 of the chuck 320 as illustrated in FIGS. 3B and 3C. The sensors will also sense other objects such as the ring 370. The data received from the sensors can be filtered as described below in order to perform calculations on the start and endpoints of the chuck 320 and determine a center 330 of the chuck, rather then the ring 370 or some other object.

Figure 4A:
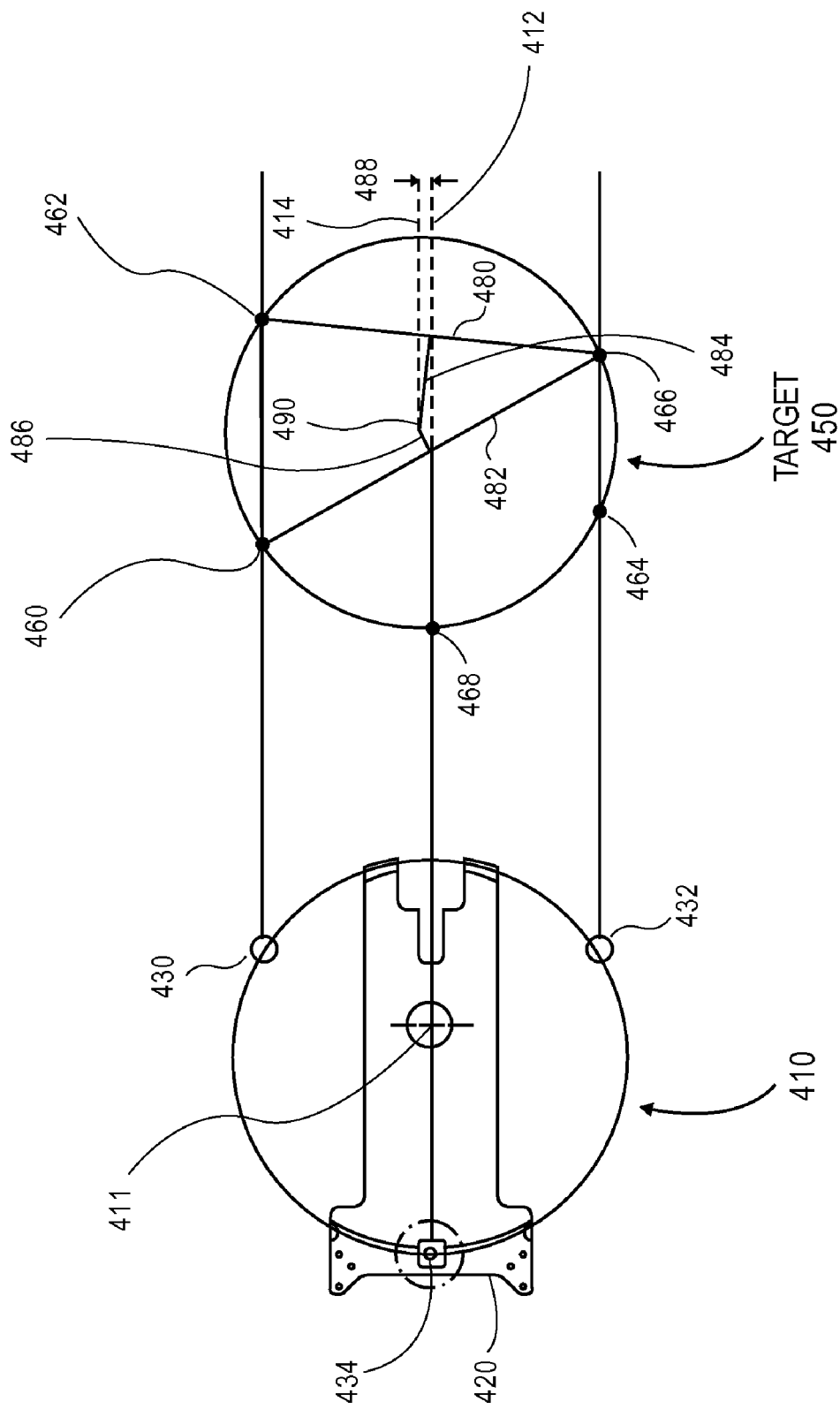
FIG. 4A illustrates a schematic view of a sensor wafer aligned with a target in accordance with one embodiment.

FIG. 4A illustrates a schematic view of a calibrating device aligned with a target in accordance with one embodiment. The calibrating device 410 (e.g., wafer, disc, or other object) is being moved by a robot blade 420 across the target 450 which may be an electrostatic chuck for one embodiment. The calibrating device 410 includes three sensors 430, 432, and 434. These sensors sense start and end point 460, 462, 464, 466, and 468 based on the robot blade 420 moving the calibrating device 410 linearly across the target 450. In one embodiment, the calibrating device 410 stops moving linearly across the target 450 when the endpoints 462 and 466 are sensed in combination with the start point 468. These sensors 430, 432, and 434 sense the variation in the distance from the location of the sensor to the target due to a change in intensity of reflected light. Using the start and end points, the center coordinates 490 of the target 450 can be calculated. In one embodiment, the center coordinates 490 of the target are then compared with a centerline 412 of the robot blade 420 in a reference position. The offset between the centerline 412 of the robot blade and the center coordinates 490 of the target derived from the sensor measurements is used to calibrate the robot position.

In another embodiment, the center coordinates 490 of the target are compared with an alignment point 411 of the robot blade 420 in a reference position. The offset between the alignment point 411 of the robot blade and the center coordinates 490 of the target derived from the sensor measurements is used to calibrate the robot position.

In one embodiment, the center coordinates 490 of the target are calculated by forming a triangle from points 460, 462, and 466. Any three points of the start and end points can be used to form a triangle. Next, perpendicular bisectors 484 and 486 are formed on sides 480 and 482 of the triangle. The intersection of the bisectors 484 and 486 represents a center or center coordinates 490 of the target 450. The offset 488 represents the difference between a center line 414 of the target and a center line 412 of the robot blade 420 in a reference position (e.g., zero position of robot blade with respect to a transfer chamber). Other geometric methods are available to perform the calculation of the offset 488 or the offset between the center line 414 of the target and the alignment point 411.

In another embodiment, a plurality of fiber-optic sensors are mounted on a calibrating device with a power supply located on the calibrating device. The calibrating device is capable of being transferred by a robot blade in order for the sensors to each sense start and end points of an arbitrary target to the calibrating device based on the positioning of the plurality of fiber-optic sensors without camera functionality. The arbitrary target 450 may be any object. A wireless module located in the calibrating device transmits the start and end points to a processing unit that calculates center coordinates 490 of the target 450 based on the start and end points of the target 450. The processing unit further determines an offset 488 between a centerline 414 of the target and a centerline 412 of the robot blade in a zero position, and calibrates a robot position based on the offset 488. Alternatively, the processing unit further determines an offset between a centerline 414 of the target or center coordinates of the target and the alignment point 411 of the robot blade in a zero position, and calibrates a robot position based on the offset.

Figure 4B:
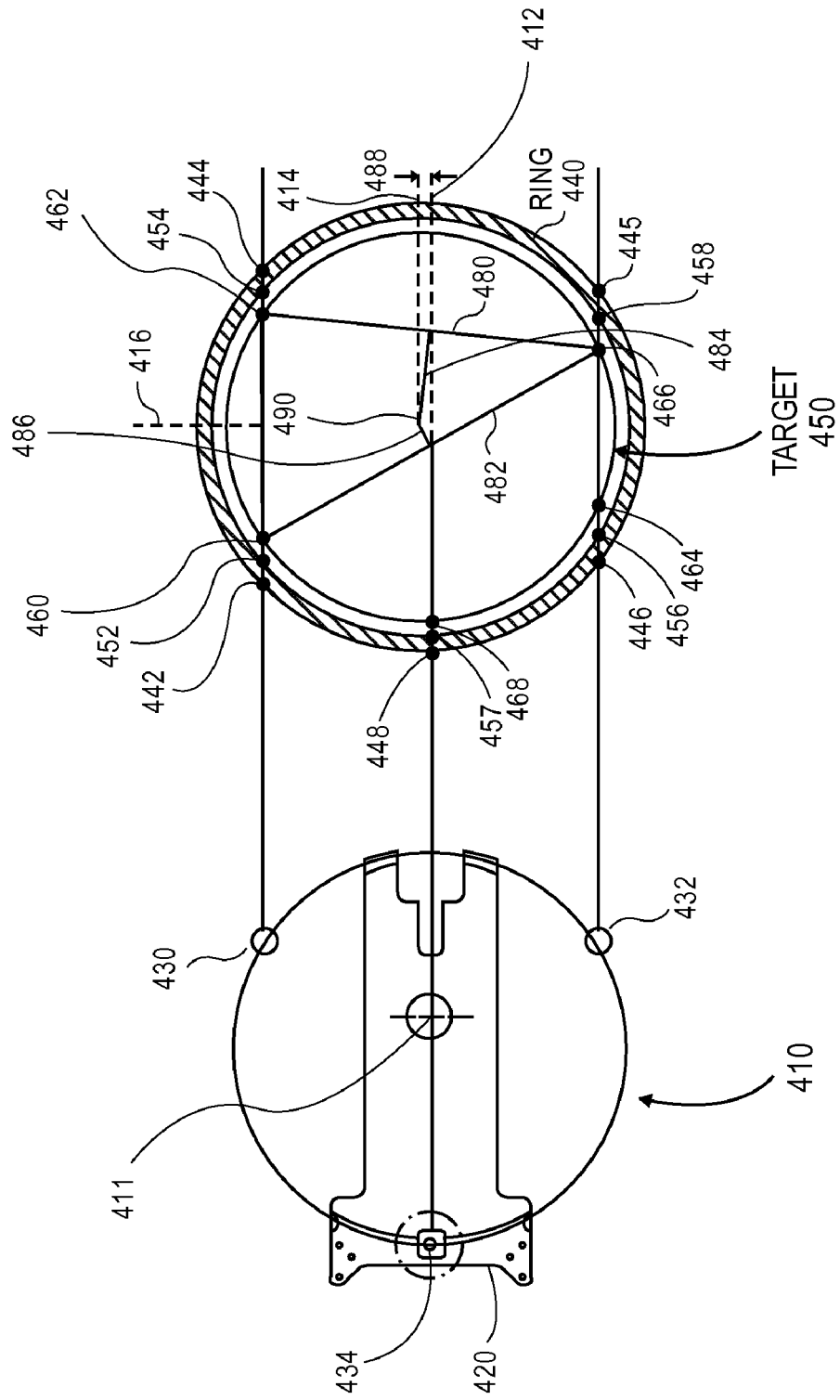
FIG. 4B illustrates a schematic view of a sensor wafer aligned with a target and a process ring in accordance with one embodiment.

The processing unit executing a software program can filter sensed data not associated with the intended target 450. For example, FIG. 4B illustrates the calibrating device 410 linearly moving across and sensing the target 450 and a process ring 440. The calibrating device 410 will sense start and end points 442, 444, 445, 446, and 448 of the outer edge of the process ring 440, start and end points 452, 454, 456, 457, and 458 of the inner edge of the process ring 440, and start and end points 460, 462, 464, 466, and 468 of the target 450.

Various criteria can be used to filter the start and end points associated with the process ring 440. In one embodiment, the sensors sense spikes, the start and end points, in order of the assembly of parts which means the parts of greater diameter (process ring 440) will be sensed prior to parts of lower diameter (target 450). In the case that the target 450 is the innermost circular part, then the last spike sensed by the sensors before a centerline 416 of the target 450 is the correct start point of the target 450. Similarly, the first spike sensed by the sensors after the centerline 416 of the target 450 is the correct end point of the target 450.

In another embodiment, the start and end points of the outer edge of the ring 440, inner edge of the ring 440, and target 450 can be used to calculate the diameter of each of the circles. The circle with the smallest diameter is that of the target 450. For example, the start and end points 460, 462, and 466 can be used to calculate the diameter of the target 450. Alternatively, the start and end points 460, 462, and 464 can be used to calculate the diameter of the target 450.

In another embodiment, the distance between the target 450 and the sensors is known in addition to the distance between the process ring 440 and the sensors. The distance sensed can be filtered to a narrow band around the distance from the sensors to the target 450.

Figure 4C:
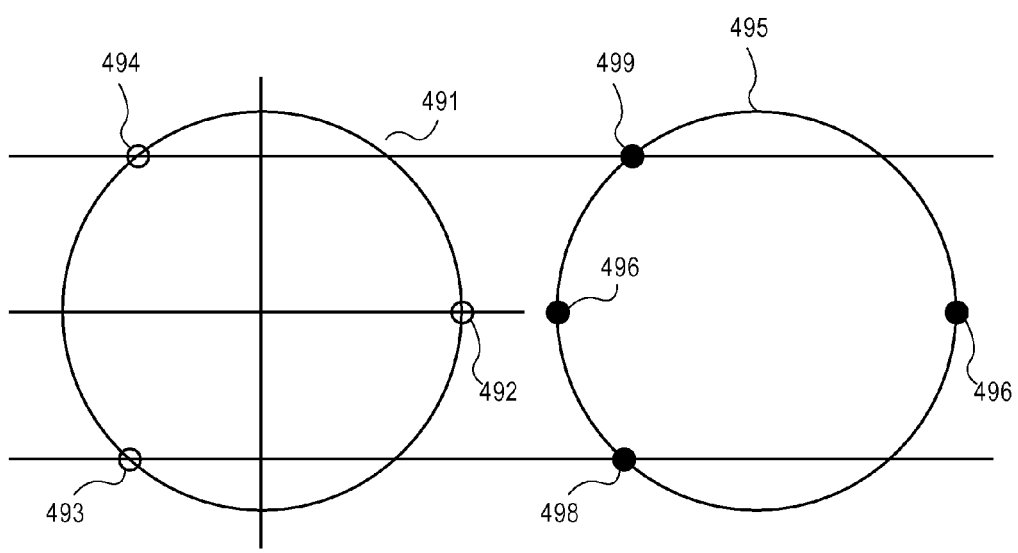
FIG. 4C illustrates a schematic view of a sensor wafer aligned with a target in accordance with another embodiment.

FIG. 4C illustrates a schematic view of a calibrating device in accordance with another embodiment. The calibrating device or calibrating device 491 includes sensors 492, 493, and 494. These sensors can be used to sense a target 495 in a similar manner as described in FIG. 4A. These sensors 492, 493, and 494 sense start and end points of the target 495 based on a robot blade moving the calibrating device 491 across the target 495. Referring to FIG. 1, a software program 184 can be executed by the processing unit 182 to determine the center coordinates of the target 495 based on the start and end points of the target 495 as illustrated in FIG. 4B.

Figure 5:
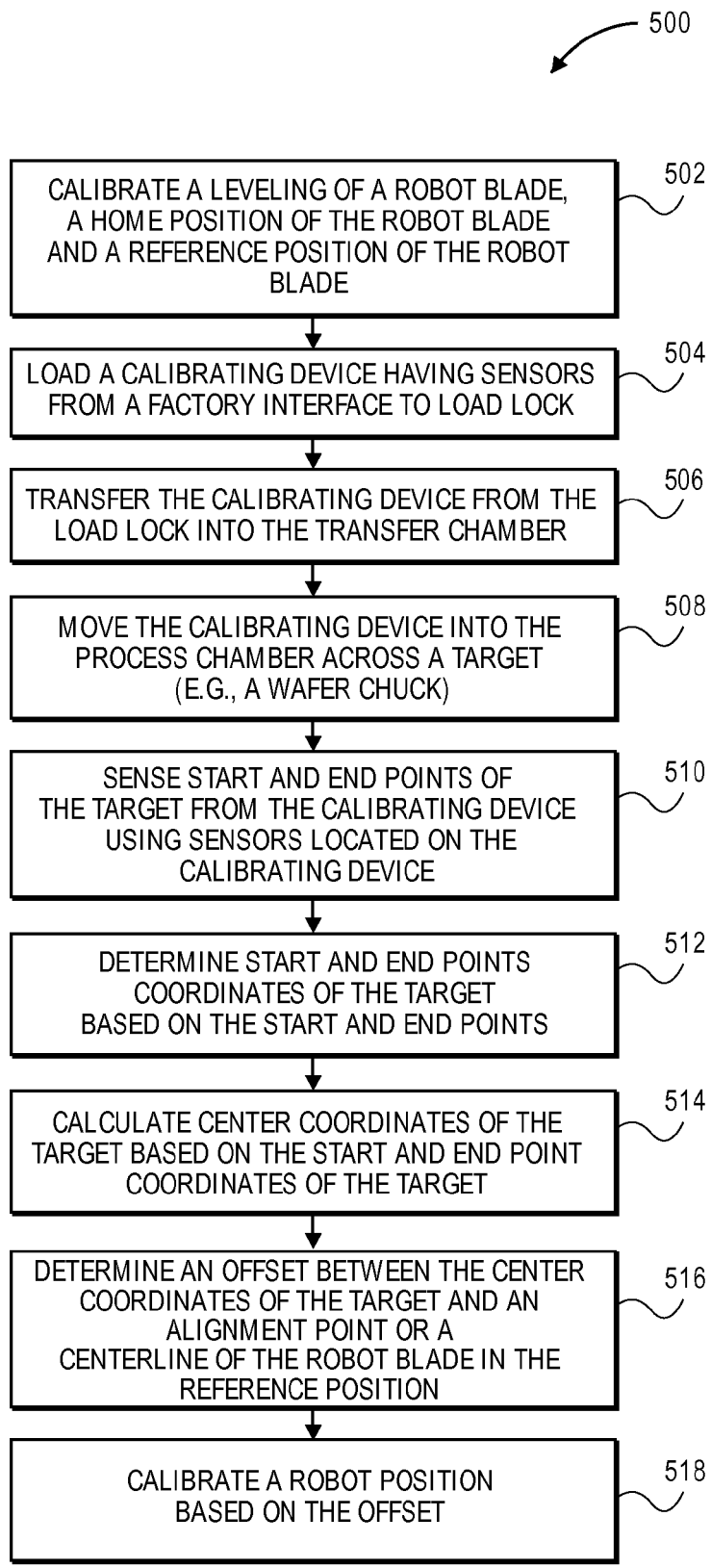
FIG. 5 illustrates a flow diagram of an embodiment for providing robot calibrations.

FIG. 5 illustrates a flow diagram of one embodiment for a method of providing robot calibrations. The method 500 includes calibrating a leveling of a robot blade, a home position of the robot blade with respect to a transfer chamber, and a zero position of the robot blade with respect to a process chamber at block 502. In one embodiment, calibrating the leveling of the robot blade ensures that the robot blade is level with reference to a slit valve of a transfer chamber and/or a load station. The home position is defined with respect to the transfer chamber. The home position is a starting position that can be repeatedly achieved using a sensor internal to the robot. Retract home sensors can be mounted on an inner shaft of the robot. These sensors are optical sensors that sense when robot flags associated with blades of the robot are inside the transfer chamber such that the robot and blades are safe to rotate. A robot is moved to a home position to ensure that the manufacturing machine knows the location of the robot. The home position is unique for each robot.

Zero position is a reference point from which all other locations are defined. Once homed, the robot is then taught the location of a zero position by a user. System software then stores an offset between the home and zero positions for later use. Zero position is not unique to each robot.

The method 500 for performing robotic calibrations further includes loading a calibrating device having sensors from a factory interface to a load lock at block 504. The method 500 further includes transferring the calibrating device from the load lock into the transfer chamber at block 506. The method 500 further includes moving the calibrating device into the process chamber across a target (e.g., a wafer chuck) at block 508. The method 500 further includes sensing start points and end points of the target from a calibrating device using sensors located on the calibrating device at block 510. The method 500 further includes determining coordinates of the start and end points of the target at block 512.

In one embodiment, a robot controller stores a current robot position in terms of step count when the sensors are triggered with start and end points of the target. A step is a minimum amount a robot can move. Coordinates of the start and end points can then be determined based on the stored robot positions associated with the start and end points.

The method 500 further includes calculating center coordinates of the target based on the start and end point coordinates of the target at block 514. For example, as previously discussed and illustrated in FIG. 4A, any three start and end points located on the perimeter of a circular target can be used to calculate the center coordinates of the circular target.

The method 500 further includes determining an offset between the center coordinates of the target and a centerline or alignment point of the robot blade in the reference position at block 516. In one embodiment, the reference position of the robot blade is the zero position. The method 500 further includes calibrating a robot position of the robot based on the offset at block 518. In one embodiment, the target is located in a process chamber and the robot position is calibrated with respect to the target in the process chamber.

Figure 6:
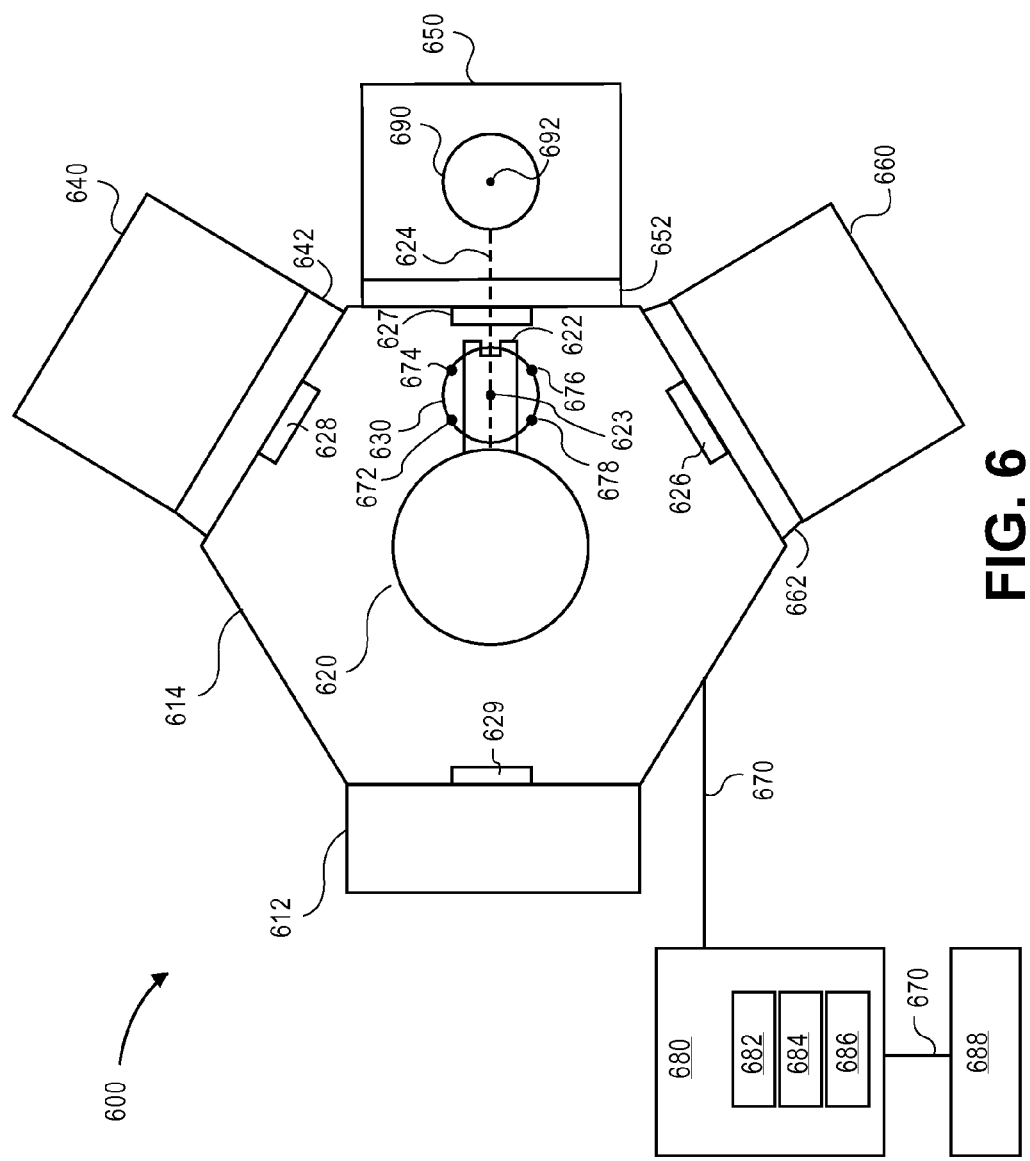
FIG. 6 illustrates another embodiment of a manufacturing machine.

FIG. 6 illustrates another embodiment of a manufacturing machine. The manufacturing machine 600 is similar to the manufacturing 100 described in conjunction with FIG. 1. However, the calibrating device 630 includes a plurality of sensors 672, 674, 676, and 678 in comparison to the calibrating device 130 having the sensors 132, 134, and 136. The calibrating devices described herein may have any arrangement of sensors and any number of sensors. The manufacturing machine 600 also includes banks of sensors 621-623 for local center find (LCF) operations that determine a position of a wafer, substrate, or calibrating device with respect to an alignment point 623 (e.g., hole, notch, indent) or centerline 624 of the robot blade 622. The alignment point 623 may be formed in a pocket of the robot blade 622 that is designed to transfer the wafers, substrates, or calibrating devices.

Figure 7:
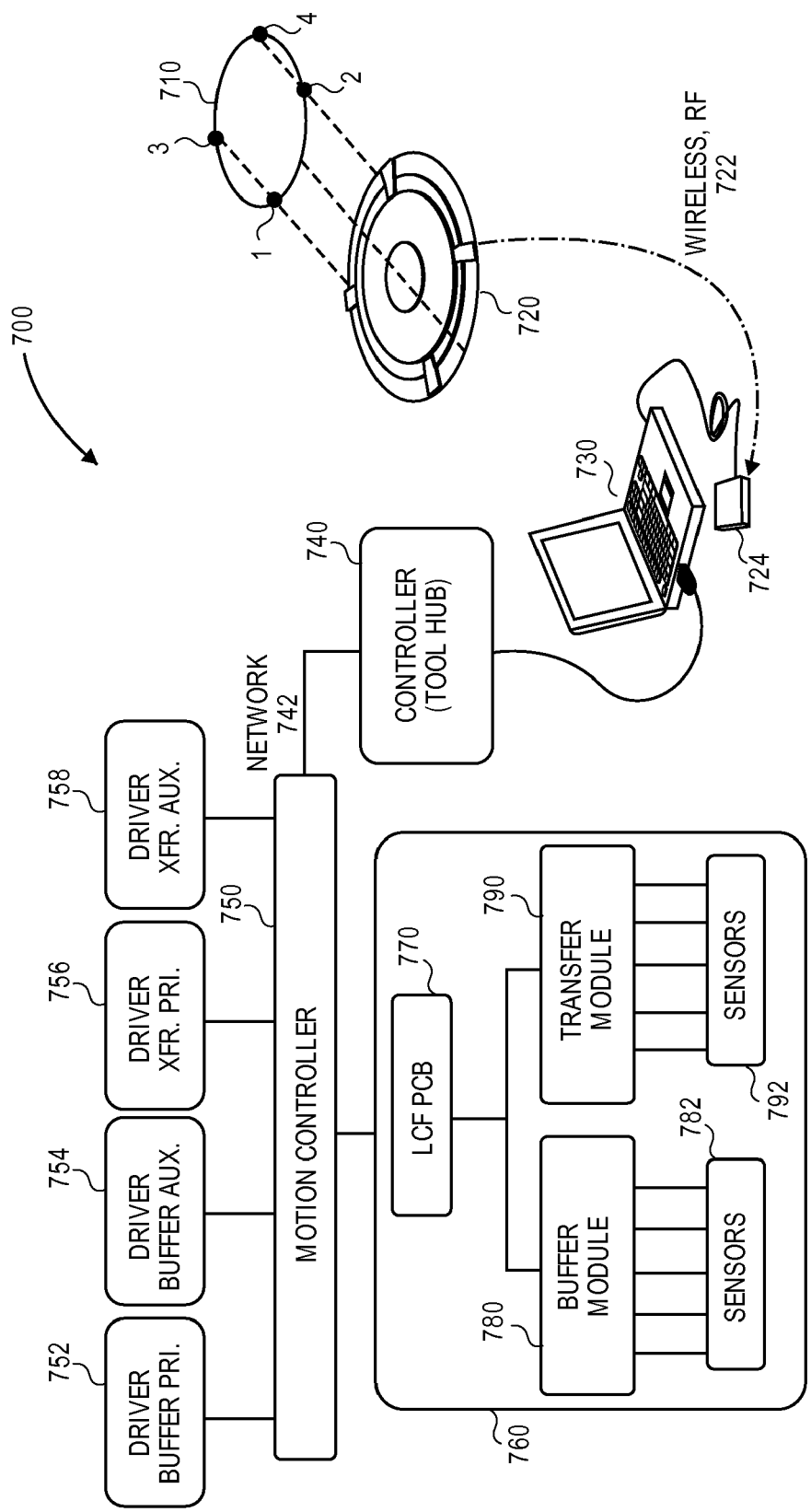
FIG. 7 illustrates one embodiment of a system architecture for a calibrating device.

FIG. 7 illustrates one embodiment of a system architecture for performing robot calibrations with a calibrating device. The calibrating device 720 is scanned across a target 710 (e.g., electrostatic wafer chuck) with a robot blade 122 in order to locate a center of the target 710 by sensing a perimeter of the target 710 (e.g., start and end points 1-4). The start and end point data measurements are then sent via a communication link 722 (e.g., wireless RF) to a transceiver 724 that is coupled to a computer 730. Alternatively, the transceiver is replaced with a receiver. The computer 730 processes the start and end point data measurements such as reflected light intensity data of the calibrating device 720 as it is scanned across the target 710. The measurements received from the calibrated device 720 are synchronized with robot motor position information from a motion controller 750 to determine the position of the robot 120 when the perimeter of the target 710 was sensed. The motion controller 750 may be coupled to the computer 730 via a controller 740 and a network 742 (e.g., local area network, wide area network). Other computers at remote locations can connect to the network 742 to monitor and analyze the robot calibrations and perform other operations. The motion controller 750 is coupled to different types of devices such as a primary buffer driver 752, an auxiliary buffer driver 754, a primary transfer driver 756, an auxiliary transfer driver 758, and a local center find unit 760 that determines a substrate, wafer, and/or calibrating device position with respect to the robot blade 622. The drivers drive servo motors and generate robot position information.

The calibration process requires the robot to move to the existing calibration position at regular speed (fast mode) and only during the scanning of the target 710 it will have to move in slow mode—forward and back by a small distance. The scan code uses a clock that counts approximately every 2 milliseconds. A slower movement ensures greater accuracy in finding the position of the robot. In an embodiment, the recommended speed of the robot during the edge scan is fixed at 5 mm/s. Co-relating the time-stamp data of robot position and edge detection signal (the position of the robot with respect to time and edge detection signal with respect to time) give the coordinates for calculating the center of the target 710.

The local center find unit 760 includes a local center find (LCF) printed circuit board (PCB) 770, buffer module 780, and transfer module 790 as well as sensors 782 and 792 (e.g., fiber optic sensors). The LCF PCB 770 collects LCF signals and transmits them to the motion controller 750 which executes motion software to calculate motion information with motion signals being sent to the drivers. The LCF PCB 770 receives LCF signals from the buffer module 780 and the transfer module 790. These modules convert optical signals received from the sensors 782 and 792 (e.g., fiber optic) into digital electrical signals. In one embodiment, the sensors 782 and 792 receive and transmit narrow beam optical signals. The sensors may be configured for various modes of sensing including diffuse reflective, through-beam, and retroreflective.

In one embodiment, the sensors 782 and 792 may be the LCF sensors 626-629 illustrated in FIG. 6. The position of the calibrating device with respect to the robot blade is performed with LCF operations. Through-beam sensors 782 and 792 are located on the top and bottom of the transfer lid at each chamber position. The disruption of these through-beam lights by the calibrating device signals the presence of the calibrating device on the blade at each chamber position. All the chambers except the passthrough chambers perform the LCF operation.

The LCF offers the two-fold benefit of calibrating device detection and centering. Centerfinding makes it possible to more accurately place the calibrating device into the process chambers. The blade and the calibrating device are moved through a bank of sensors. Calibrating device edge points are located by latching the robot motor positions at the leading edge transition and trailing edge transition for each sensor in the sensor bank. The LCF passes through a two sensor bank during extend and retract. The motion positions are latched in the motion controller 750. The motion module software converts the two motion positions to rotation and extension coordinates. As illustrated in FIG. 7, during LCF operation the sensors send the optical signals and connect to fiber optic modules or amplifiers. These modules convert the optical LCF signals to digital signals for communication back to the LCF PCB 770 and the motion controller 750. More details regarding LCF operations and positioning are disclosed in U.S. Pat. No. 6,556,887 which is herein incorporated by reference.

When calibrating the LCF operations, a special calibration wafer is put onto the robot blade. This wafer is positioned at the center of the robot blade with a centering pin. During calibration, this wafer is moved through the sensor bank, and a calibration correction value is calculated. The correction value is the difference in extension steps for LCF between the expected value calculated from the robot geometry, sensor bank geometry, LCF rotation and the latched value. A calibration value is saved for each transition of each sensor. Separate values are used for extend and retract robot paths. Separate values are also used for each blade in a dual blade robot.

LCF corrections are calculated while retracting a wafer, substrate, or calibrating device from the source chamber. If rotation/extension correction exceeds maximum settings, then faults occur in front of the source chamber. If rotation/extension corrections are acceptable, then the calibrating device is rotated to destination chamber's calibrated position. The calibrating device is extended into destination chamber, first using LCF corrections (rotation/extension) calculated from source chamber. Once the calibrating device goes thru the destination chambers LCF banks, LCF corrections are calculated and applied at the end of the move. There is no need to re-calibrate when the transfer chamber lid is opened. If calibrating device movement occurs during rotation/extension, LCF will correct calibrating device placement.

Improved calibration accuracy is expected by doing a normal wafer transfer of a target wafer to the target, which may be an electrostatic chuck/pedestal, and then scanning with the calibrating device to measure the offset of the target wafer on the target. This will eliminate most error contributors such as error due to blade tilt, LCF calibration, calibration of sensor location, edge selection by software, etc.

The substrate, wafer, or calibrating device can be properly positioned on various types of robot blades without needing locking hardware between the robot blade and the substrate, wafer, or calibrating device.

Figure 8:
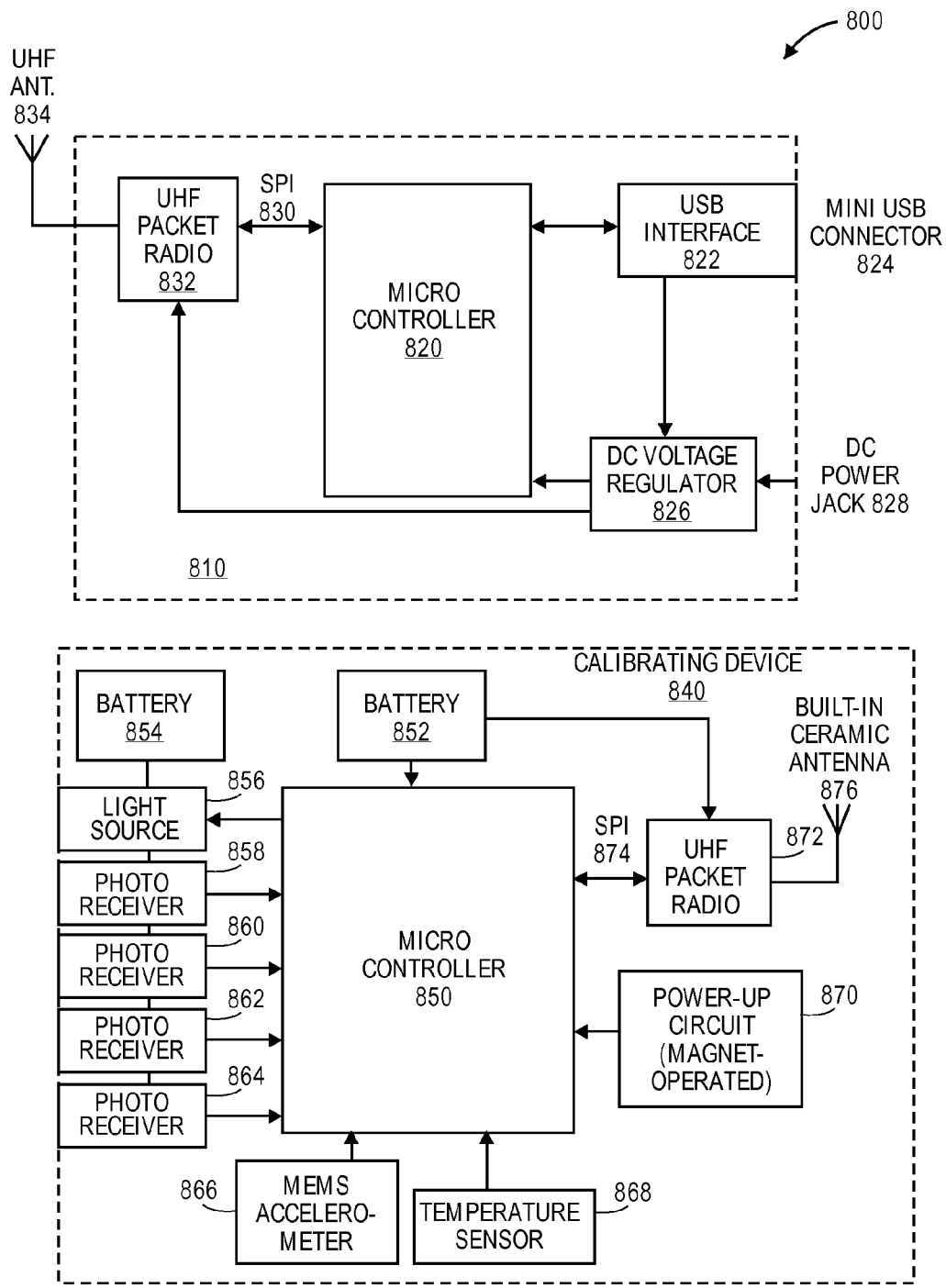
FIG. 8 illustrates one embodiment of a block diagram of a calibrating device and receiver.

FIG. 8 illustrates one embodiment of a block diagram of a calibrating device and a receiver. The receiver 810, which may be a transceiver, includes a microcontroller 820, a USB interface 822, mini USB connector 824, a DC voltage regulator 826, a DC power jack 828, a SPI link 830, an ultra high frequency (UHF) packet radio 832, and an UHF antenna 834 which may be an external whipple antenna. In one embodiment, the receiver 810 has dimensions of 31 by 60 by 112 millimeters (mm) with an 80 mm external antenna.

The calibrating device 840 includes a microcontroller 850, a battery 852, a battery 854, a light source 856, photoreceivers 858, 860, 862, 864, an accelerometer 866, a temperature sensor 868, a power-up circuit 870, an UHF packet radio 872, and an antenna 876 which may be an internal ceramic antenna. The calibrating device 840 and receiver 810, which can be a transceiver, communicate with each other via the antennas 834 and 876. The batteries are any type of high temperature (e.g., up to 125 degrees Celsius (C)) batteries such as lithium ion that can be exposed to a chamber temperature of 450 degrees C. for a short time period such as one to eight minutes.

In one embodiment, the calibrating device enters a bi-directional, slow communication mode with the receiver 810 and the computer 730. The calibrating device 840 is powered up with power-up circuit 870 which may be a magnet over reed switch. The calibrating device 840 is initially in low power mode with RF listening occurring approximately every 300 milliseconds (ms). Then, the calibrating device 840 receives a wake-up signal from the transceiver or the wake-up signal may be directly received from the computer 730. The wake-up signal contains some or all of the initialization parameters. The calibrating device 840, upon receiving the wake-up signal, enters a short period when the microcontroller 850 and radio 874 are both running, and the radio 874 is in continuous receive mode, waiting for the synchronization signal. If such signal is not received for some reason within a short time interval, the calibrating device 840 goes back to slow receive mode. Parameters from the computer 730, such as acquisition time, light level, calibrating device mode (optical or accelerometer), etc. are initialized. Then, report current status, such as mode, temperature, battery status, and user programmable variables (e.g., optical sensors, calibration position error/pointing error) are sent as the acknowledgment packet in reply to the wakeup signal/configuration packet.

Next, a receive synchronization signal from the computer 730 is received as well as a report clock signal. After receiving the second synchronization packet from the computer 730, the calibrating device 840 will rest its internal clock and reply to the receiver 810 with another acknowledgment packet. Then it immediately enters the main loop and sends the requested data (light or acceleration readings) the preprogrammed number of times. If in Optical Sensing Mode, the calibrating device 840 turns on LEDs to a programmed light level. The calibrating device 840 outputs 4× amplitude signal levels (light-dark) in high speed mode. The internal temperature will be checked and compared to warning level (75° C.) and inserted into some or every message in the form of a service bit (above threshold or not). If the internal temperature exceeds maximum temperature level (85° C.) then a second service bit will be set, to tell the software of the computer 730 to extract the calibrating device 840 from the chamber. Power down occurs after a certain length of time such as 10 minutes of no activity. This time period can be set by the computer 730.

The calibrating device 840 has similar functionality in accelerometer mode. Power down occurs if the calibrating device 840 receives an "off" command. This is possible from slow receive mode because during the active phase of operation the calibrating device 840 may not listen to the receiver 810.

The accelerometer 866 measures and reports acceleration in three dimensions (e.g., X, Y, Z) and provides a root mean square (RMS) display. The accelerometer 866 is capable of measuring acceleration with a minimum full-scale range of ±3 g. A g is equal to the nominal acceleration of gravity on Earth at sea level, defined as 9.80665 m/sec$^2$ (32.174 ft/s$^2$). The accelerometer 866 is capable of measuring static acceleration of gravity in tilt-sensing applications, as well as dynamic acceleration resulting from motion, shock, or vibration. The accelerometer 866 has a resolution of ±0.01 g or better. A software graphical user interface (GUI) shows vibration data in relation to the robot position. The accelerometer 866 has an operating temperature range similar to the operating temperature range of the calibrating device 840, which is 0 to 125 degrees C. in accordance with one embodiment and 0 to 200 degrees C. in accordance with another embodiment.

Figure 9A:
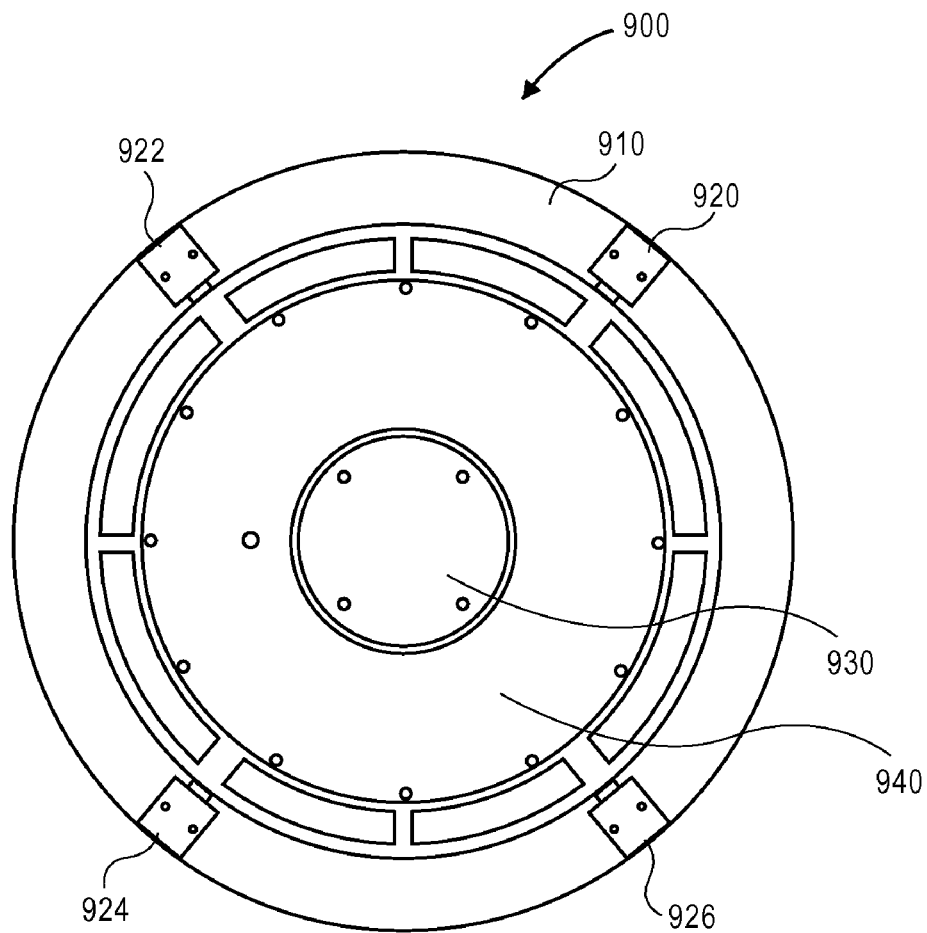
FIG. 9A illustrates a top view and FIG. 9B illustrates a side view of a calibrating device in accordance with one embodiment.
Figure 9B:
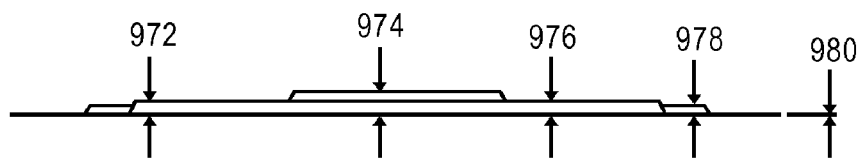

FIG. 9A illustrates a top view and FIG. 9B illustrates a side view of a calibrating device formed with a composite material in accordance with one embodiment. The top view of the calibrating device 900 illustrates an outer ring 910, sensor mounts 920, 922, 924, and 926, a removable battery cover 930, and an outer cover 940. The outer ring 910 or outer section may be any light weight, high temperature, low particle material (e.g., aluminum). The removable battery cover 930 and the outer cover 940 form an inner section that is formed from any light weight, high temperature, low particle, flat material or composite material (e.g., aluminum, carbon reinforced polymer). This material or composite material needs to have a flatness of Ra 16 or better to ensure proper chucking on a pre-aligner. Individual variances of the peaks and valleys of a surface of the material are averaged to obtain the Ra reading. A surface that exhibits a Ra of 16 consists of peaks and valleys that average no more than 16 microinches over a given distance.

The side view of the calibrating device illustrates various thicknesses of sections of the calibrating device. In one embodiment, the thickness 972 is about 4.7 millimeters (mm), the thickness 974 is about 7.5 mm, the thickness 976 is about 5 mm, the thickness 978 is about 4 mm, and the thickness 980 is about 0.7 mm.

In an embodiment, a carbon reinforced polymer may include an oxy-1,4-phenylene-oxy-1,4-phenylene-carbonyl-1,4-phenylene polymer such as Victrex PEEK™. This linear aromatic polymer is semi-crystalline and is widely regarded as a high performance thermoplastic material with a wide frequency and temperature range. PURITY VICTREX PEEK™ materials are inherently pure with exceptionally low levels of ionic extractables and excellent outgassing characteristics.

Figure 10A:
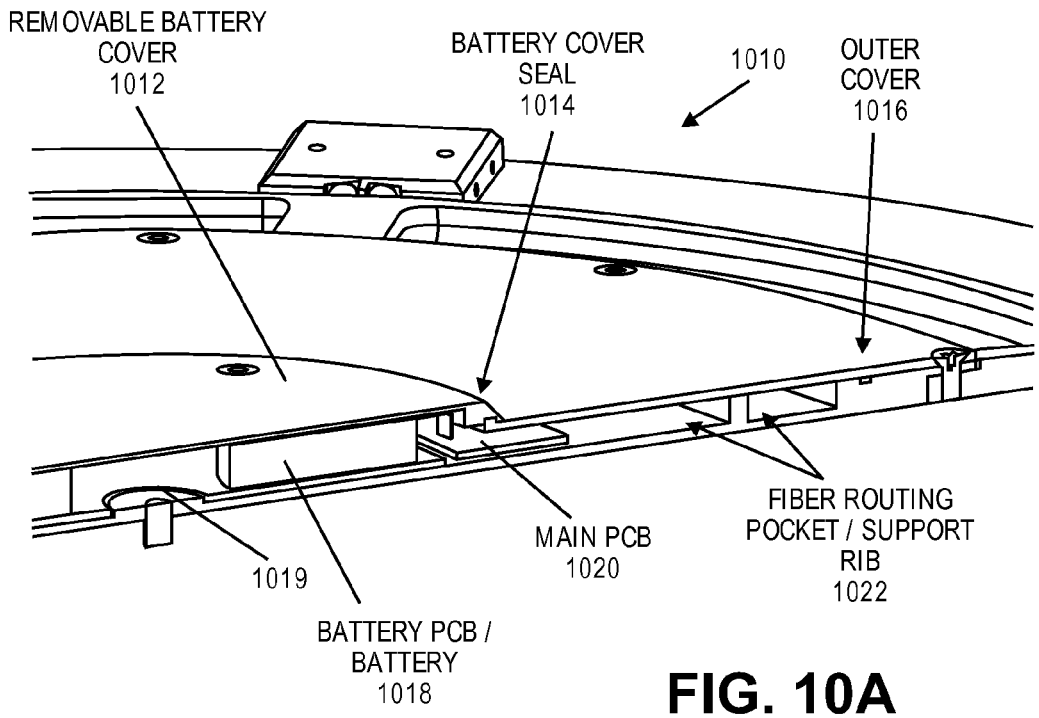
FIG. 10A illustrates a cross-sectional view of a calibrating device in accordance with one embodiment.

FIG. 10A illustrates a cross-sectional view of a composite calibrating device in accordance with one embodiment. The calibrating device 1010 includes a removable battery cover 1012, a battery cover seal 1014, an outer cover 1016, one or more batteries 1018, a battery printed circuit board (PCB) 1019, a main PCB 1020, and a fiber routing pocket/support rib 1022.

In one embodiment, the removable battery cover 1012 and the outer cover 1016 are formed with a carbon reinforced polymer and the fiber routing pocket/support rib 1022 is formed with aluminum. In another embodiment, the removable battery cover 1012, the outer cover 1016, and the fiber routing pocket/support rib 1022 are formed with aluminum. In another embodiment, the removable battery cover 1012, the outer cover 1016, and the fiber routing pocket/support rib 1022 are formed with a carbon reinforced polymer.

Figure 10B:
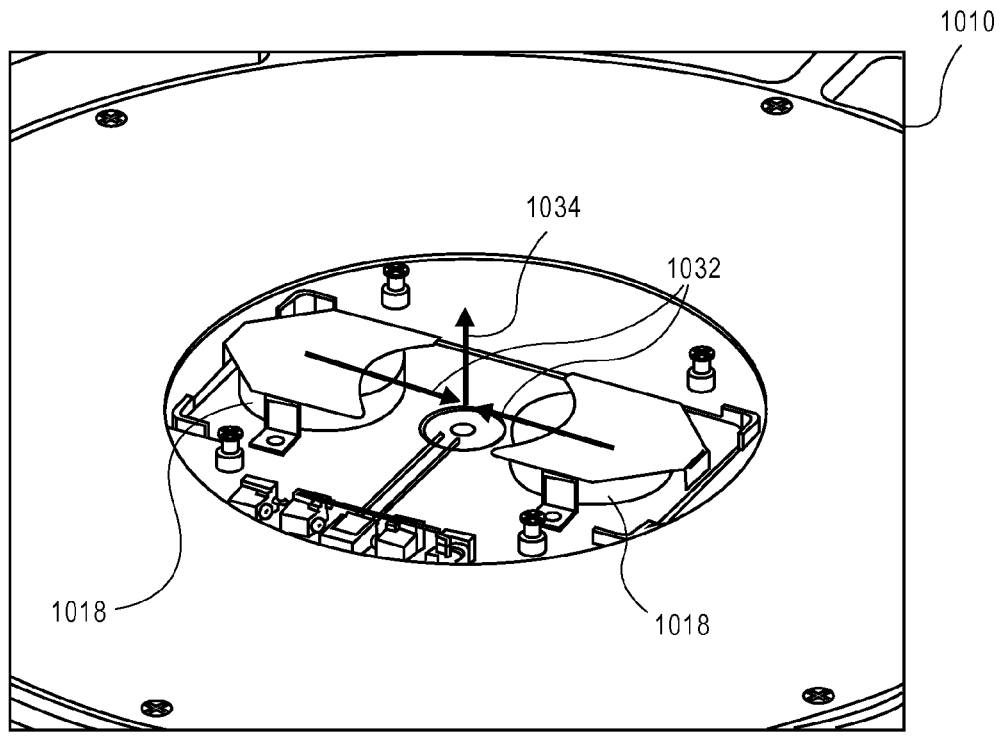
FIG. 10B illustrates a top view of a calibrating device having a battery cover removed in accordance with one embodiment.

FIG. 10B illustrates a top view of the calibrating device 1010 having the battery cover 1012 removed in accordance with one embodiment. The batteries 1018 can be removed by sliding 1032 the batteries and lifting 1034 out.

Figure 10C:
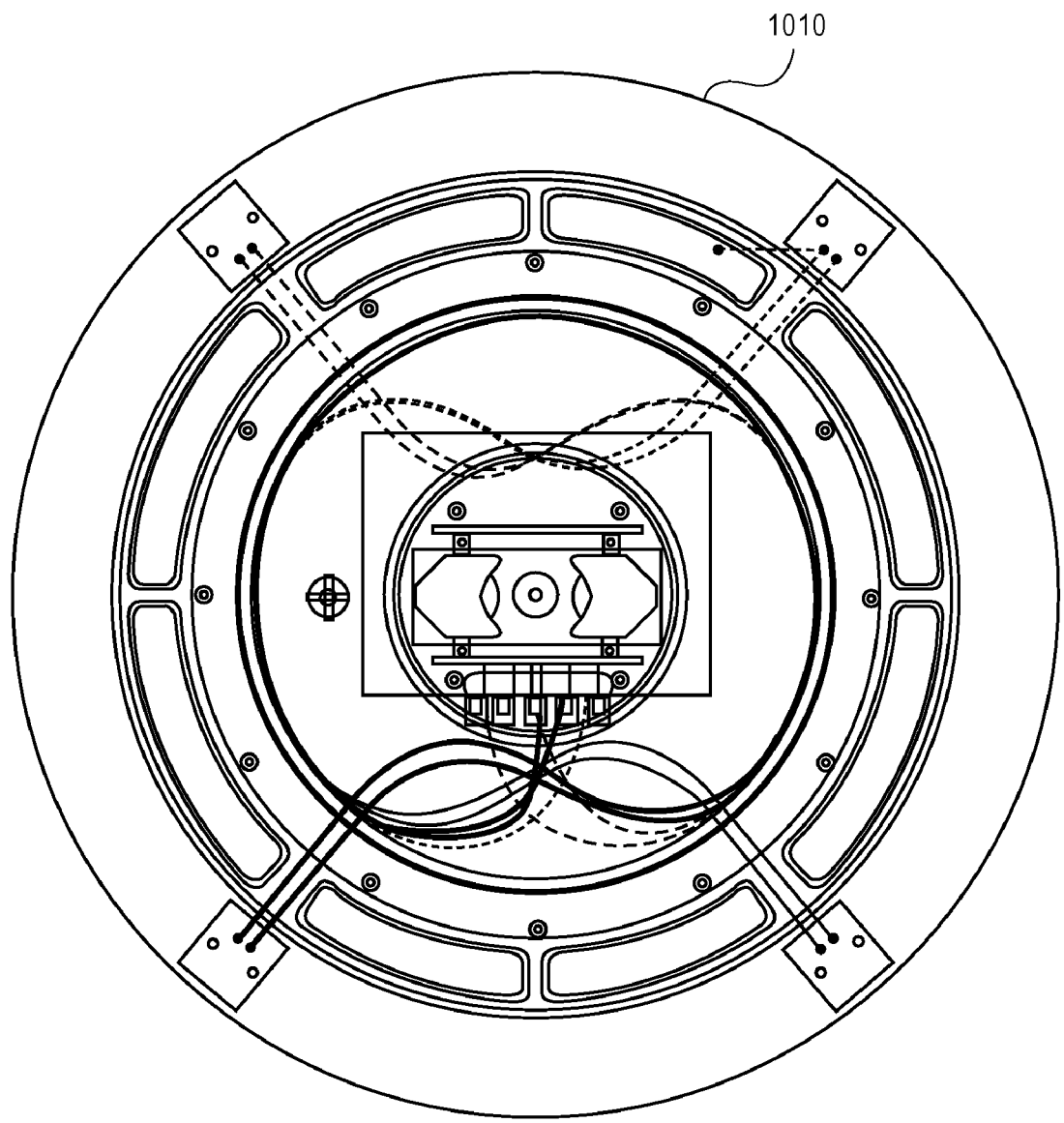
FIG. 10C illustrates a top view of a calibrating device having a battery cover and an outer cover removed in accordance with one embodiment.

FIG. 10C illustrates a top view of the calibrating device 1010 having the battery cover 1012 and the outer cover 1016 removed in accordance with one embodiment.

Figure 11:
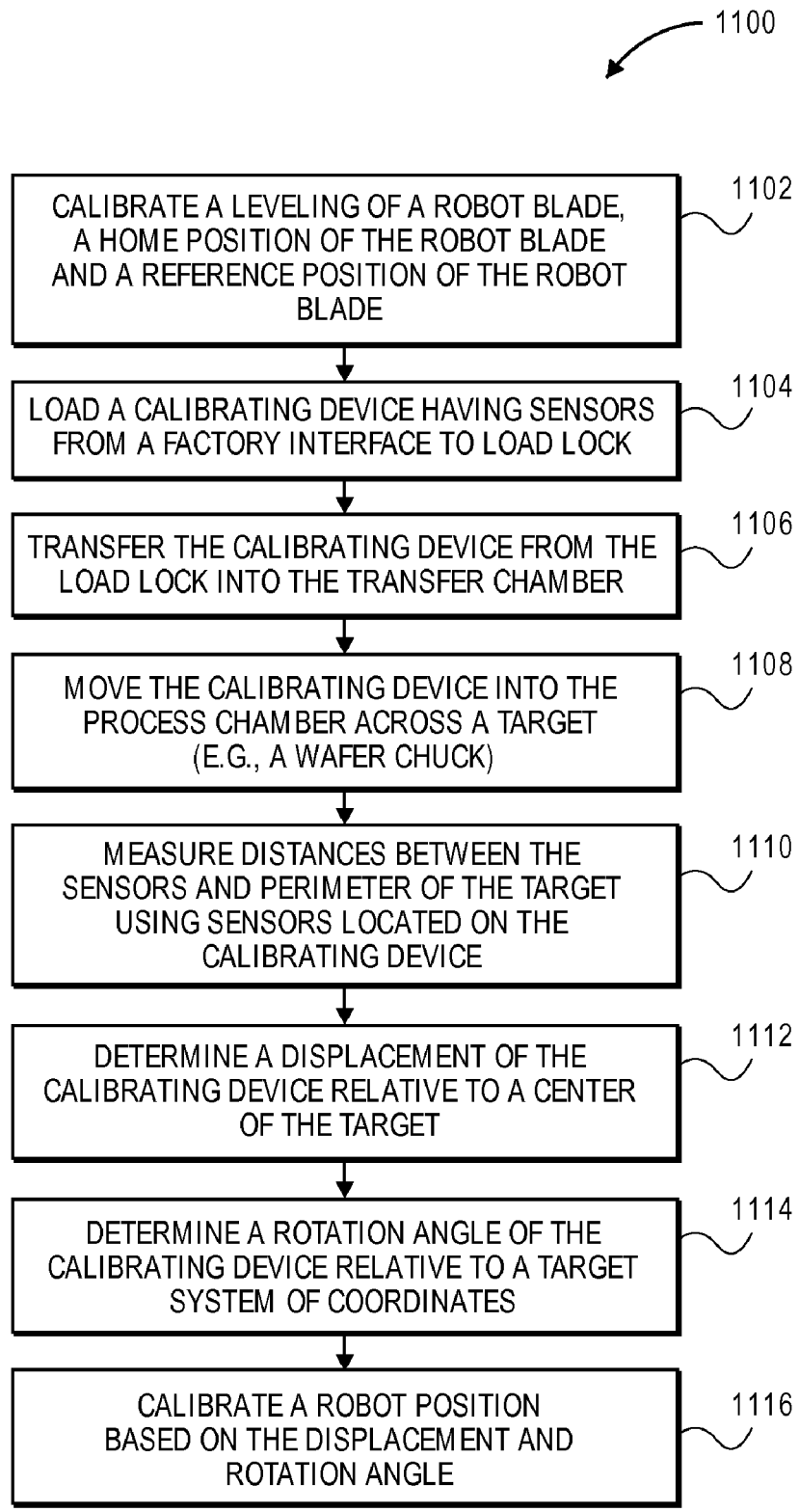
FIG. 11 illustrates a flow diagram of another embodiment for providing robot calibrations.

FIG. 11 illustrates a flow diagram of one embodiment for a method of providing robot calibrations. The method includes calibrating a leveling of a robot blade, a home position of the robot blade with respect to a transfer chamber, and a zero position of the robot blade with respect to a process chamber at block 1102. In one embodiment, calibrating the leveling of the robot blade ensures that the robot blade is level with reference to a slit valve of a transfer chamber and/or a load station. The home position is defined with respect to the transfer chamber. The home position is a starting position that can be repeatedly achieved using a sensor internal to the robot. Retract home sensors can be mounted on an inner shaft of the robot. These sensors are optical sensors that sense when robot flags associated with blades of the robot are inside the transfer chamber such that the robot and blades are safe to rotate. A robot is moved to a home position to ensure that the manufacturing machine knows the location of the robot. The home position is unique for each robot.

Next, the method for performing robotic calibrations includes loading a calibrating device having sensors from a factory interface to a load lock at block 1104. Next, the method includes transferring the calibrating device from the load lock into the transfer chamber at block 1106. Next, the method includes moving the calibrating device into the process chamber across a target (e.g., a wafer chuck) at block 1108. The robot may enter a slow scan mode when the calibrating device reaches an edge of the target or a previously calibrated position and repeatedly scan back and forth at a slow rate. Next, the method includes measuring distances between light spots from the sensors and a perimeter of the target using the sensors located on the calibrating device at block 1110. Next, the method includes determining a displacement of the calibrating device relative to a center of the target at block 1112. Then, the method includes determining a rotation angle of the calibrating device relative to a system of coordinates of the target at block 1114.

Next, the method includes calibrating a robot position of the robot based on the displacement and rotation angle of the calibrating device with respect to the target at block 1116. In one embodiment, the target is located in a process chamber and the robot position is calibrated with respect to the target in the process chamber.

FIG. 12A illustrates a top view of a calibrating device 1200 in a first coordinate system 1210 in accordance with one embodiment. The calibrating device 1200 includes a plurality of sensors which can be in any arrangement including the arrangement illustrated in FIG. 12A. In one embodiment, four edge sensors 1212, 1214, 1216, and 1218 have coordinates $(x_1, y_1)$, $(x_2, y_2)$, $(x_3, y_3)$, $(x_4, y_4)$, respectively. These coordinates of the sensors are known relative to the center of the calibrating device 1200 because the calibrating device has fixed dimensions (e.g., 300 mm diameter). In this case, the coordinates of the sensor can be represented as $(x_i, y_i)$, where $1<=i<=4$ is the index for the optical sensors of the calibrating device 1200. Then, depending on the rotation angle theta $\theta$ (see FIG. 12C) of the calibrating device 1200 in the first coordinate system (e.g., calibrating device coordinate system) relative to a second coordinate system, such as the target coordinate system 1260, illustrated in FIG. 12B, and a displacement of the calibrating device 1200 relative to the target 1250, the coordinates of the light spots of the sensors in the target coordinate system 1200 are as follows:

$$x'_i = x_i * \cos(\theta) + y_i * \sin(\theta) + x_0$$

$$y'_i = -x_i * \sin(\theta) + y_i * \cos(\theta) + y_0 \quad\quad 1)$$

Where $x_0$, $y_0$ are displacements of the calibrating device 1200 relative to the center of the target 1250 in the x and y directions and $\theta$ is the rotation angle. The target coordinate system 1260 is presumably centered in a center 1270 of the target 1250 with the Y axis pointing in the direction of the robot motion. The calibrating device 1200 is moved back and forth in the Y direction in order to measure $d_i$ ->distances between light spots and boundaries of the target 1250. Coordinates of the intersections of the light spots and boundaries of the target are defined as:

$$x''_i = x'_i = x_i * \cos(\theta) + y_i * \sin(\theta) + x_0$$

$$y''_i = y'_i + d_i = -x_i * \sin(\theta) + y_i * \cos(\theta) + y_0 + d_i \quad\quad 2)$$

Provided that the target 1250 has a circular shape, then the sum of squares of the x" and y" coordinates for each optical sensor must be equal to:

$$x''^2_i + y''^2_i = x''^2_j + y''^2_j \quad\quad 3)$$

for all i and j (e.g., i=1 and $2<=j<=4$).

The three equations described above are independent resulting in a system of three nonlinear equations with 3 unknown variables: $x_0$, $y_0$ and $\theta$. These nonlinear equations can be resolved using known digital methods for resolving nonlinear equations. Then, as discussed at block 1116, a robot position of the robot is calibrated based on the displacement $(x_0, y_0)$ and rotation angle $\theta$ of the calibrating device with respect to the target.

Figure 13:
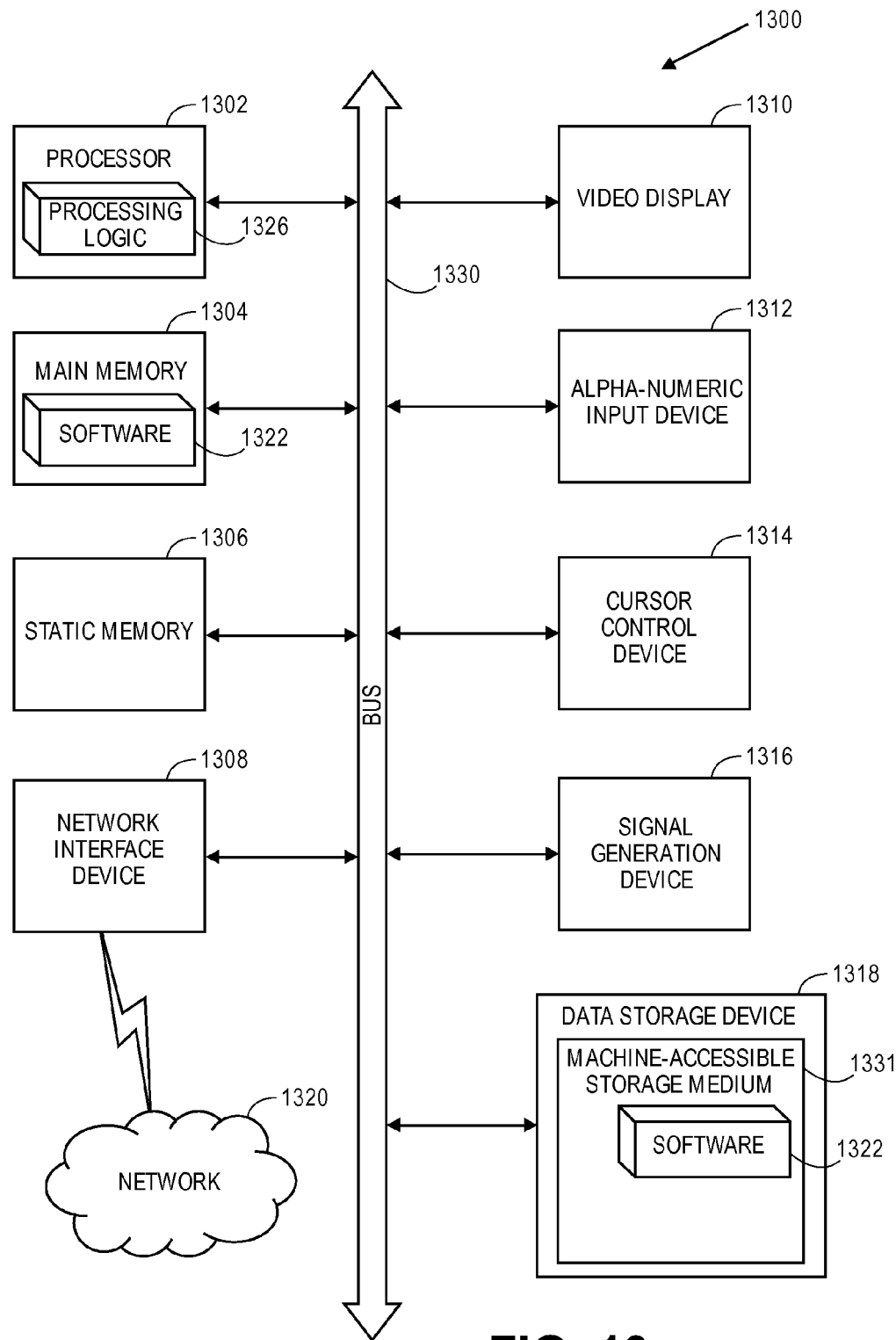
FIG. 13 illustrates a diagrammatic representation of a machine in the exemplary form of a computer system within which a set of instructions, for causing the machine to perform any one or more of the methodologies discussed herein, may be executed.

FIG. 13 illustrates a diagrammatic representation of a machine in the exemplary form of a computer system 1300 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 1300 includes a processing device (processor) 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a data storage device 1318, which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 1302 may also be one or more special-purpose processing devices such as an application specific integrated circuit (ASIC), a field programmable gate array (FPGA), a digital signal processor (DSP), network processor, or the like. The processor 1302 is configured to execute the processing logic 1326 for performing the operations and steps discussed herein.

The computer system 1300 may further include a network interface device 1308. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), and a signal generation device 1316 (e.g., a speaker).

The data storage device 1318 may include a machine-accessible storage medium 1331 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-accessible storage media. The software 1322 may further be transmitted or received over a network 1320 via the network interface device 1308.

The machine-accessible storage medium 1331 may also be used to store data structure sets that define user identifying states and user preferences that define user profiles. Data structure sets and user profiles may also be stored in other sections of computer system 1300, such as static memory 1306.

While the machine-accessible storage medium 1331 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instructions for execution by the machine and that cause the machine to perform any one or more of the methodologies of the present invention. The term "machine-accessible storage medium" shall accordingly be taken to include, but not be limited to, solid-state memories, optical media, and magnetic media.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed description which follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, calibrating discussions utilizing terms such as "processing", "computing", "calculating", "determining", "displaying" or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMS, magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes a machine readable storage medium (e.g., read only memory ("ROM"), random access memory ("RAM"), magnetic disk storage media, optical storage media, flash memory devices, etc.).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method, comprising:
   sensing a plurality of start points and end points of a target using a plurality of sensors located on a calibrating device;
   calculating a center of the target based on the start points and the end points; and
   determining an offset between the center of the target and a robot blade in a reference position wherein the robot blade moves the calibrating device into a process chamber during the sensing of the start and the end points of the target and a lid of the process chamber is closed during calibration of a robot position.

2. The method of claim 1, further comprising calibrating the robot position based on the offset.

3. The method of claim 1, wherein calculating the center of the target further comprises determining start and end point coordinates of the target based on the start points and the end points being associated with robot positions.

4. The method of claim 1, further comprising:
   calibrating a leveling of the robot blade;
   calibrating a home position of the robot blade with respect to a transfer chamber; and
   calibrating a zero position of the robot blade.

5. The method of claim 1, wherein the target is an electrostatic wafer chuck located in the process chamber.

6. An apparatus, comprising:
   a plurality of fiber-optic sensors mounted on a calibrating device comprising a composite material; and
   a power supply located on the calibrating device, wherein the calibrating device is capable of being transferred by a robot blade into a processing chamber in order for the fiber-optic sensors to sense start and end points of a target based on the positioning of the plurality of fiber-optic sensors wherein a lid of the process chamber is closed during calibration of a robot position.

7. The apparatus of claim 6, further comprising:
   a wireless module located in the calibrating device to transmit the start and end points to a processing unit that calculates center coordinates of the target based on the start and end points, determines an offset between the center coordinates of the target and a centerline of the robot blade in a zero position, and calibrates the robot position based on the offset.

8. The apparatus of claim 7, further comprising:
   an amplifier located on the calibrating device to amplify data communicated between the processing unit and the calibrating device; and
   an accelerometer located on the calibrating device to measure acceleration in three dimensions.

9. The apparatus of claim 6, wherein the composite material comprises aluminum and carbon reinforced polymer with the composite material being capable of operating at high temperatures under vacuum with exposure to processing gases.

10. The apparatus of claim 6, wherein the calibrating device is shaped like a semiconductor wafer with a weight in the range of 100 grams to 350 grams and has a thickness less than or equal to 0.25 inches.

11. A calibrating device, comprising:
a microcontroller to control operations of the calibrating device; and
a plurality of photoreceivers coupled to the microcontroller, wherein the calibrating device is capable of being transferred by a robot blade into a processing chamber in proximity to a target in order for the photoreceivers to receive light indicating start and end points of the target based on the positioning of the photoreceivers wherein a lid of the process chamber is closed during calibration of a robot position.

12. The calibrating device of claim 11, further comprising:
a packet radio coupled to the microcontroller, the packet radio to transmit the start and end points to a processing unit that calculates center coordinates of the target based on the start and end points, determines an offset between the center coordinates of the target and a centerline of the robot blade in a zero position, and calibrates the robot position based on the offset; and
a temperature sensor coupled to the microcontroller, the temperature sensor to sense a temperature of the calibrating device, wherein calibrating device is removed from a processing chamber if the temperature of the calibrating device exceeds a maximum temperature for the calibrating device.

13. The calibrating device of claim 11, wherein the calibrating device comprises a composite material that includes aluminum and carbon reinforced polymer with the composite material being capable of operating at high temperatures under vacuum with exposure to processing gases.

* * * * *